United States Patent
Suda

(10) Patent No.: US 7,492,198 B2
(45) Date of Patent: Feb. 17, 2009

(54) PHASE-LOCKED LOOP CIRCUIT, DELAY LOCKED LOOP CIRCUIT, TIMING GENERATOR, SEMICONDUCTOR TEST INSTRUMENT, AND SEMICONDUCTOR INTEGRATED CIRCUIT

(75) Inventor: Masakatsu Suda, Tokyo (JP)

(73) Assignee: Advantest Corp., Tokyo (JP)

( * ) Notice: Subject to any disclaimer, the term of this patent is extended or adjusted under 35 U.S.C. 154(b) by 355 days.

(21) Appl. No.: 10/493,130

(22) PCT Filed: Oct. 18, 2002

(86) PCT No.: PCT/JP02/10834

§ 371 (c)(1), (2), (4) Date: Apr. 16, 2004

(87) PCT Pub. No.: WO03/036796

PCT Pub. Date: May 1, 2003

(65) Prior Publication Data

US 2004/0247066 A1 Dec. 9, 2004

(30) Foreign Application Priority Data

Oct. 19, 2001 (JP) ............................. 2001-322642

(51) Int. Cl.
*H03L 7/06* (2006.01)
(52) U.S. Cl. .............................. 327/158; 327/2; 327/12; 327/156; 375/376
(58) Field of Classification Search ......... 327/154–163, 327/12, 9, 8, 7, 5, 3, 2, 10; 375/373–376; 331/17, 25; 377/115–117
See application file for complete search history.

(56) References Cited

U.S. PATENT DOCUMENTS

| 4,181,862 | A | * | 1/1980 | Dingwall | 377/117 |
| 5,121,014 | A | * | 6/1992 | Huang | 327/276 |
| 5,619,148 | A | * | 4/1997 | Guo | 327/3 |
| 5,945,856 | A | * | 8/1999 | Yanagiuchi | 327/159 |
| 6,194,930 | B1 | * | 2/2001 | Matsuzaki et al. | 327/156 |
| 6,522,175 | B2 | * | 2/2003 | Ueno et al. | 327/103 |
| 6,526,109 | B1 | * | 2/2003 | Chang et al. | 375/371 |

FOREIGN PATENT DOCUMENTS

| JP | 07-142997 | 6/1995 |
| JP | 11-065699 | 3/1999 |
| JP | 11-205131 | 7/1999 |
| JP | 2000-124779 | 4/2000 |

* cited by examiner

*Primary Examiner*—Tuan T. Lam
*Assistant Examiner*—Diana J Cheng
(74) *Attorney, Agent, or Firm*—Muramatsu & Associates

(57) ABSTRACT

A PLL and DLL are designed such that the power consumption is reduced, the size is reduced, the band width of the locked loop is increased, and the reliability is improved. There are provided a phase comparator for measuring the value of a feedback signal in synchronism with an input signal and outputting a phase signal representing the lead or lag of the phase of the feedback signal, a counter for increasing by one the number of bits representing "H" in a control signal when the phase signal represents the lead of the phase or decreasing by one the number of bits representing "H" in the control signal when the phase signal represents the lag of the phase, and a ring oscillator for increasing the oscillation period when the number of bits representing "H" in the control signal increases or decreasing the oscillation period when the number of bits representing "H" decreases.

14 Claims, 28 Drawing Sheets

FIG.3

|  | CONTROL SIGNAL BITS | | | | | | | | | |
|---|---|---|---|---|---|---|---|---|---|---|
|  | 1 | 2 | 3 | 4 | 5 | 6 | 7 | ... | 38 | 39 |
| 0TH TIME | 1 | 1 | 1 | 1 | 0 | 0 | 0 | ... | 0 | 0 |
| 1ST TIME | 1 | 1 | 1 | 0 | 0 | 0 | 0 | ... | 0 | 0 |
| 2ND TIME | 1 | 1 | 0 | 0 | 0 | 0 | 0 | ... | 0 | 0 |
| 3RD TIME | 1 | 1 | 1 | 0 | 0 | 0 | 0 | ... | 0 | 0 |
| 4TH TIME | 1 | 1 | 1 | 1 | 0 | 0 | 0 | ... | 0 | 0 |
| 5TH TIME | 1 | 1 | 1 | 1 | 1 | 0 | 0 | ... | 0 | 0 |

(A)

(B)

(C)

(D)

(A)

(B)

(C)

(A)

(B)

(A)

(B)

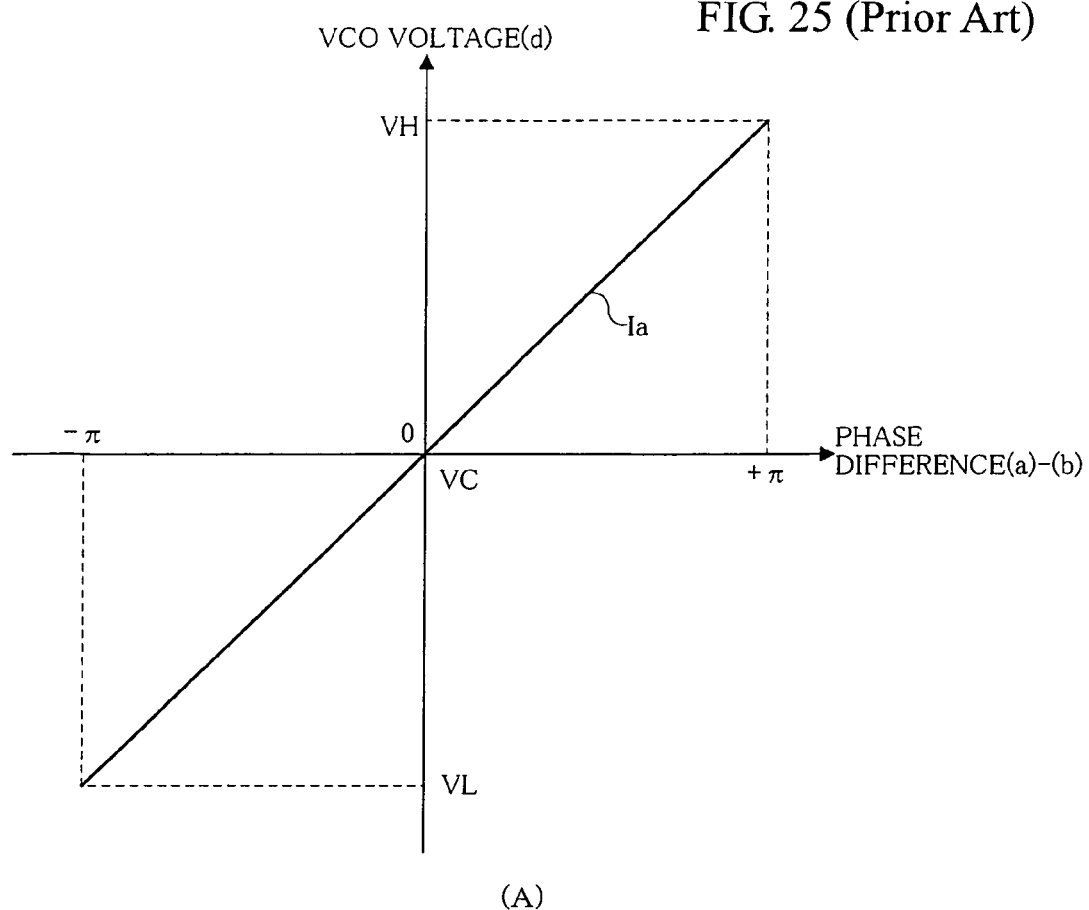
FIG. 25 (Prior Art)
(A)
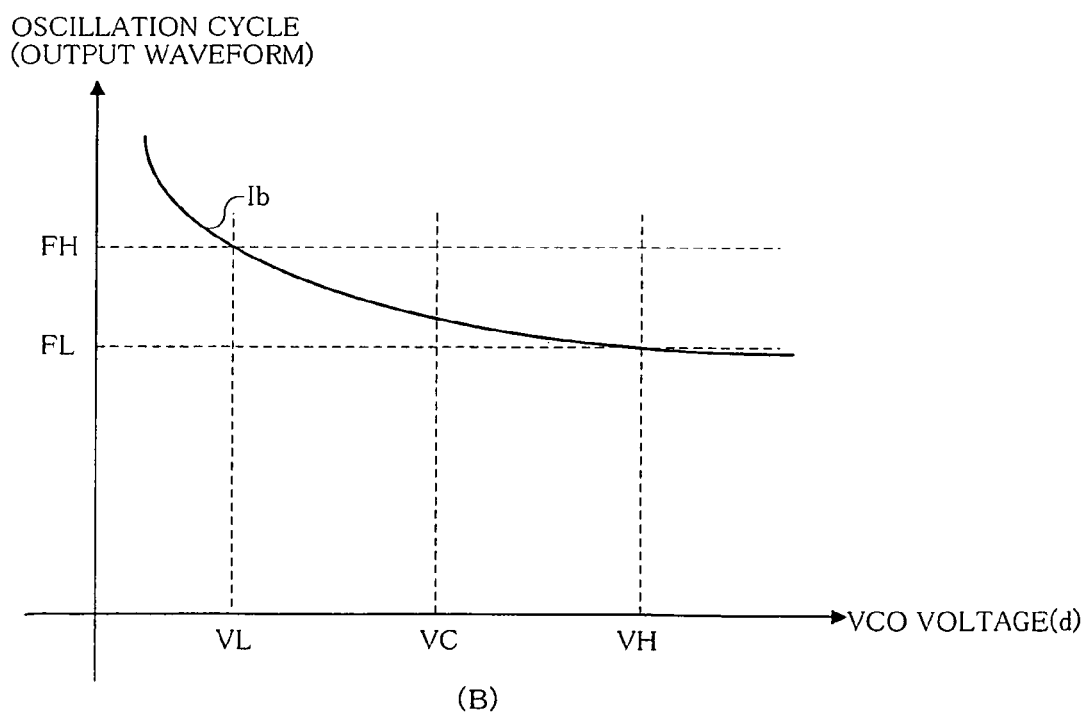
(B)

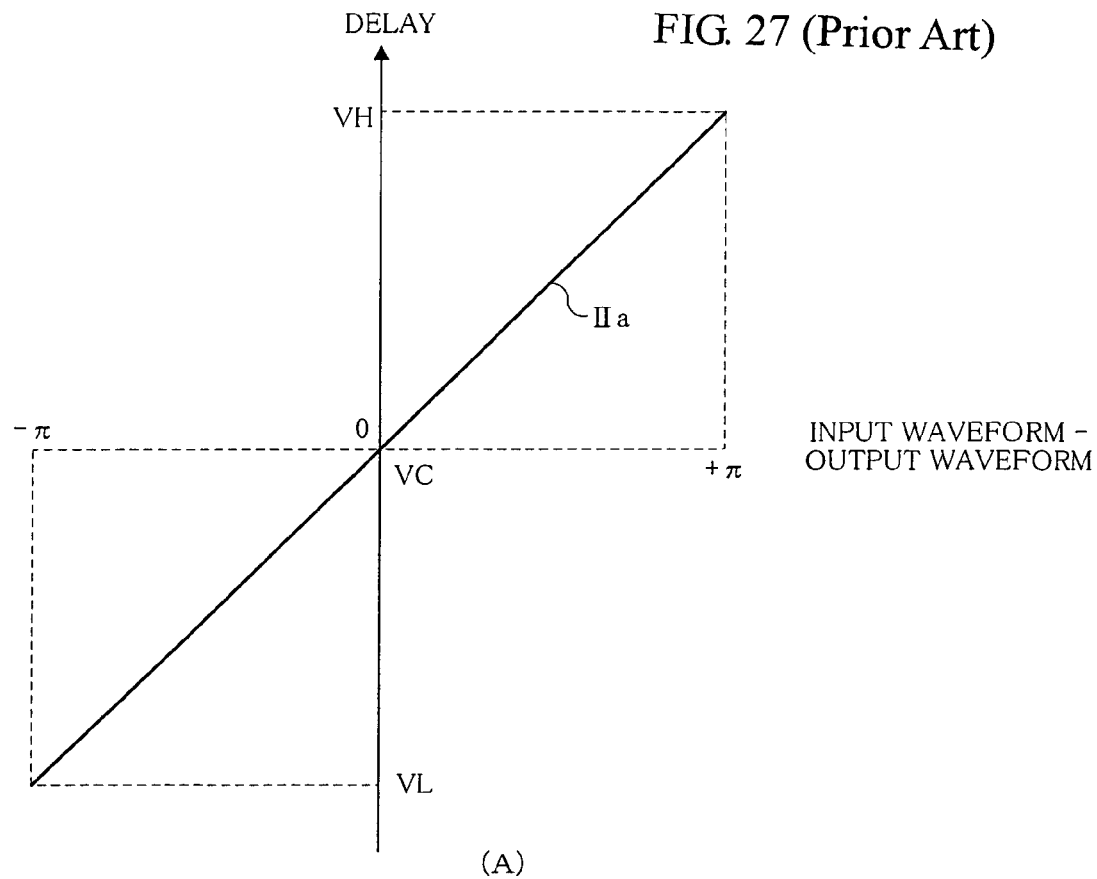
FIG. 27 (Prior Art)
(A)
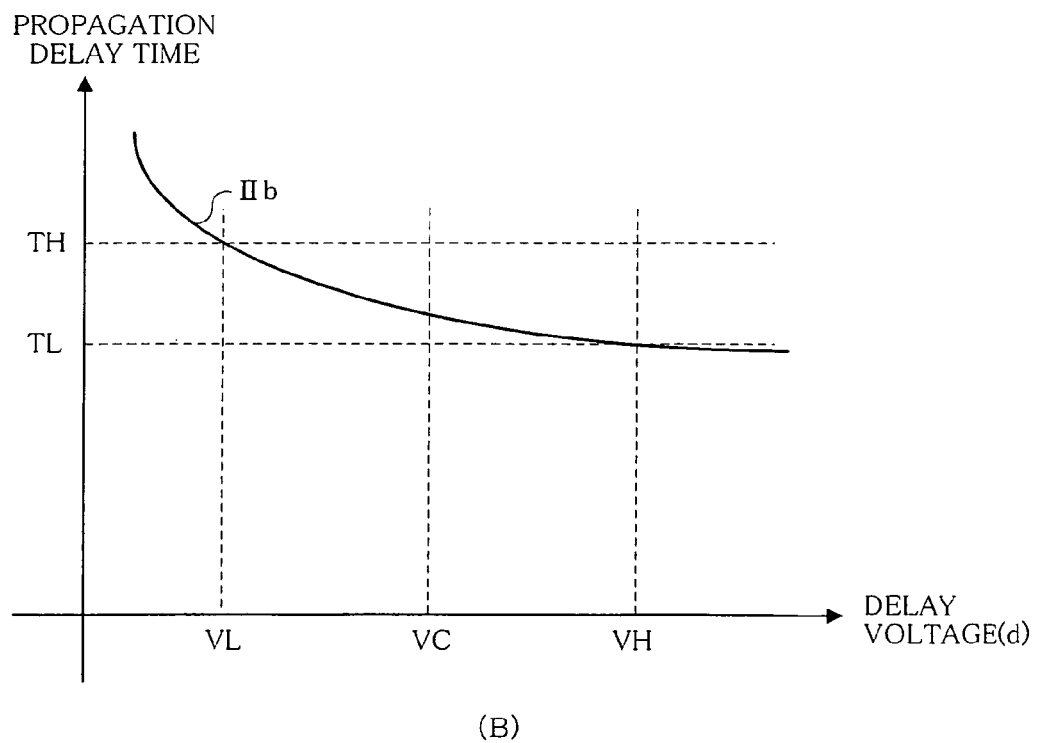
(B)

US 7,492,198 B2

PHASE-LOCKED LOOP CIRCUIT, DELAY LOCKED LOOP CIRCUIT, TIMING GENERATOR, SEMICONDUCTOR TEST INSTRUMENT, AND SEMICONDUCTOR INTEGRATED CIRCUIT

TECHNICAL FIELD

The present invention relates to a digital-controlled phase-locked loop circuit (PLL) comprising logic elements, a delay locked loop circuit (DLL), a timing generator utilizing the DLL, a semiconductor test instrument including the timing generator, and a semiconductor integrated circuit equipped with the PLL.

BACKGROUND ART

Prior to explaining the present invention, a constitution of a conventional general PLL will be described.

As shown in FIG. 24(A), a conventional PLL comprises a phase comparator 101, a charge pump 102, a low pass filter (LPF) 103, a voltage controlled oscillator (VCO) 104, and a frequency divider 105.

As shown in FIGS. 24(A) and (B), the phase comparator 101 compares an input waveform with a divided waveform obtained by dividing an output waveform of the VCO 104 by the frequency divider 105. Further, it performs an operation to detect how much a phase of the divided waveform is delayed from a phase of the input waveform, and an operation to detect how much the phase of the divided waveform is ahead of the phase of the input waveform. It is to be noted that FIG. 24(B) shows a detected lag component of the phase in the form of a waveform b-1 and a detected lead component of the phase in the form of a waveform b-2. Here, a phase difference is represented with a pulse width.

Then, the charge pump 102 combines the lag component (b-1) and the lead component (b-2) into one signal (c) and amplifies the thus combined signal. Here, a polarity of a pulse of the lead component is inverted.

Subsequently, the LPF 103 eliminates a high-frequency component in the combined waveform (c), and converts a pulse width representing the phase difference into a voltage (d). Here, as shown in FIG. 25(A), a voltage is high as the phase difference of the lag component is large, and the voltage is low as the phase difference of the lead component is large.

The VCO 104 converts the voltage into a delay time (free running frequency of the oscillator). As shown in FIG. 25(B), an oscillatory frequency becomes high and the phase advances as an output voltage (VCO voltage) of the LPF 104 is high, and the oscillatory frequency becomes low and the phase is delayed as the output voltage is low.

Furthermore, the frequency divider 105 divides an output waveform of the VCO, and generates a divided waveform obtained by converting the obtained result into a frequency in the vicinity of a frequency of the input waveform.

As described above, in the PLL, the output waveform is feedback-controlled in such a manner that the phase of the divided waveform and the phase of the input waveform become fixed.

A structure of a conventional general DLL will now be described.

As shown in FIG. 26(A), a DLL according to a prior art comprises a phase comparator 101, a charge pump 102, a low pass filter (LPF) 103, and a variable delay circuit 106.

As shown in FIG. 26(B), the phase comparator 101, the charge pump 102 and the LPF 104 detect a lead, a lag and their degrees (b-1, b-2) of a phase of an output waveform to a phase of an input waveform like the example of the PLL mentioned above, convert a phase difference (c) into a voltage difference (d), and input the result to the variable delay circuit (DELAY) 106. Here, as shown in FIG. 27(A), likewise, the voltage is high as the phase difference of a lag component is large, and the voltage is low as the phase difference of a lead component is large.

Moreover, the DELAY 106 converts the voltage difference into a delay time like the VCO 105. As shown in FIG. 27(B), a propagation delay time of the output waveform to the input waveform is short as an output voltage (DELAY voltage) of the LPF 104 is high, and the propagation delay time is long as the output voltage is low.

As described above, in the DLL, the delay time is feedback-controlled in such a manner that the phases of the output waveform and the input waveform become fixed.

Meanwhile, in FIG. 25(A) and FIG. 27(A), a relationship between the phase difference and the VCO voltage is shown in the form of linear graphs, but it is not necessarily linear in a practical sense. When an SR latch is utilized for the phase comparator in particular, the linearity of the VCO voltage (or the DELAY voltage) is especially poor in the vicinity of a point where the phase difference is zero as shown in FIG. 28. Therefore, in the conventional PLL or DLL, there is a problem that the accuracy of the phase lock is deteriorated. For example, since a pulse width which passes through a CMOS logic gate is finite, it is determined that there is "no phase difference" in some cases even if a phase difference is actually produced.

Additionally, the above-described PLL or DLL according to the prior art comprises an analog circuit. Therefore, there are problems that a power consumption is large, a circuit scale is increased and a cost is high.

For example, a circuit in which an OP amplifier is used for the phase comparator has large power consumption and is hard to be reduced in size. Further, a circuit in which PMOS and NMOS analog switches and an OP amplifier are used for the charge pump also has large power consumption and is hard to be reduced in size.

Furthermore, in regard to a regulator which changes a voltage variable range of the VCO or the DELAY, a power consumption becomes large when an operating speed is increased, and a dimension of the regulator also becomes large. Therefore, this can be an obstacle in increasing a lock loop frequency band.

Moreover, since the analog circuit includes a circuit whose response speed is low such as an OP amplifier or an LPF, it is hard to perform phase locking with the high accuracy in a high frequency band in the PLL or DLL using the conventional analog circuit.

Additionally, in recent years, as a frequency of an operating clock of a semiconductor integrated circuit becomes high, there is a demand of high timing accuracy without a skew. However, in a large-scale chip such as a logic circuit, there is a problem that a skew is generated between parts distanced from each other on the chip due to irregularities in characteristics of relay buffers for clock signals.

It is to be noted that an example of the digital-controlled DLL is disclosed in Japanese Patent Application Laid-open No. 2000-124779. According to the technique disclosed in this publication, until the phase locking is applied, a lead or a lag of a phase is detected, a detection result is represented by using a binary counter, setting of a delay circuit is performed by binary search combined with a decoder, and a count value is increased or decreased one by one after the locking is applied. As a result, a lockup time is reduced, and the accuracy of an output frequency is improved.

However, in a binary search operation in which the binary counter is combined with the decoder, values of a plurality of bits may be simultaneously reversed in some cases. Therefore, a so-called whisker may be applied to a selector of the delay circuit, which may possibly lead to a malfunction. For example, when a value of the binary counter is counted up from "01111" to "10000", all the bits are reversed. As a result, a plurality of delay circuits are simultaneously selected by a skew of the decoder, and a whisker may possibly occurs in a clock.

In view of the above-described problems, it is an object of the present invention to provide digitally-controlled PLL and DLL which have small power consumption, can be readily reduced in size, enable a locked loop in a high frequency band and have the high reliability, a timing generator utilizing the DLL, a semiconductor test instrument including the timing generator, and a semiconductor integrated circuit including the PLL.

DISCLOSURE OF THE INVENTION (PLL)

To achieve this aim, according to the present invention, there is provided a phase-locked loop circuit (PLL) comprising: feedback means for outputting an output signal which is a binary signal as a feedback signal; a phase comparator which receives the feedback signal and an input signal and outputs a phase signal representing a lead or a delay of a phase of the feedback signal relative to the input signal; a counter which receives the phase signal, increases a value in the control signal when the phase signal has a value representing a lead of the phase, and decreases the value in the control signal when the phase signal has a value representing a lag of the phase; and a ring oscillator which receives the control signal, produces the output signal, prolongs an oscillation cycle of the output signal when the number of values in the control signal is large, and shortens the oscillation cycle of the output signal when the number of values is small.

More specifically, the present invention has a structure in which the feedback means comprises a frequency divider; the frequency divider divides the output signal which is the binary signal and outputs a feedback signal which is the binary signal; the phase comparator receives the feedback signal and the input signal, detects a value of the feedback signal in synchronization with the input signal and outputs a detection result as a phase signal representing a lead or a lag of a phase of the feedback signal compared to the input signal; the counter receives the phase signal, outputs a control signal comprising a plurality of bits each of which represents a first value or a second value, increases the number of bits representing the first value in the control signal by one when the phase signal has a value representing a lead of the phase, and decreases the number of bits representing the first value in the control signal by one when the phase signal has a value representing a lag of the phase; and the ring oscillator receives the control signal, produces the output signal, prolongs the oscillation cycle of the output signal when the number of bits representing the first value in the control signal is large and shortens the oscillation cycle of the output signal when the number of bits representing the first value is small.

According to such a digital-controlled PLL of this invention, by providing a circuit configuration based on logic elements without using analog circuits, a reduction in power consumption, size of a circuit scale and cost can be achieved.

Furthermore, according to the PLL of the present invention, since an analog circuit whose response speed is low is not used, especially an LPF is not used, a phase can be locked with the high accuracy in a higher band. Therefore, a lock loop band can be improved. Moreover, according to the PLL of the present invention, in the phase comparator, a lead or a lag of a phase is detected as a value of the feedback signal in synchronization with the input signal irrespective of a phase difference. Therefore, the reliability of the phase comparison can be improved. Additionally, in the present invention, since a priority encoder type counter which increases/decreases the number of bits representing the first value in the control signal by one based on the phase signal is used, only the value of one bit is changed at a time in the control signal. Thus, the reliability can be improved.

Further, in the present invention, the phase comparator is constituted of a D flip-flop (D-FF). By configuring the phase comparator by using the D-FF in this manner, a value of the feedback signal can be readily detected in synchronization with the input signal and can be held.

Furthermore, according to the present invention, the phase comparator comprises: a first D flip-flop which detects a lag of the phase; a second D flip-flop which detects a lead of the phase; a first variable delay element which adjusts an input signal to the first D flip-flop by an amount corresponding to a switch phase difference of an output value of the first D flip-flop which has detected a lag of the phase; and a second variable delay element which adjusts an input signal to the second D flip-flop by an amount corresponding to a switch phase difference of an output value of the second D flip-flop which has detected a lead of the phase. With this arrangement, decreasing skews of the first D flip-flop and the second D flip-flop by using the first and second variable delay elements can reduce hysteresis. As a result, occurrence of jitters due to overrun after achieving the phase lock can be suppressed. Moreover, a time required for the phase to be locked can be reduced, and it is possible to cope with a higher frequency band.

Additionally, according to the present invention, the phase comparator comprises a dynamic D flip-flop and a non-dynamic D flip-flop to which an output from the dynamic D flip-flop is inputted, the dynamic D flip-flop has a structure in which dynamic latch circuits each of which is configured by combining an analog switch with a parasitic capacitance are connected on two stages in a subordinate manner, and the non-dynamic D flip-flop has a structure in which latch circuits each of which is configured by combining an analog switch with an inverter are connected on two stages in a subordinate manner. With such an arrangement, inputting an output of the dynamic D flip-flop to the non-dynamic D flip-flop can narrow a hysteresis width in an output of the non-dynamic D flip-flop. As a result, occurrence of jitters due to overrun after achieving the phase lock can be suppressed. Further, a time required for the phase to be locked can be shortened, and it is possible to cope with a higher frequency band.

Furthermore, according to the present invention, the counter includes flip-flops and selectors which select signals to be inputted to the flip-flops, the number of the flip-flops and the number of the selectors being equal to the number of bits in the control signal; each of the flip-flops outputs bit values constituting the control signal one by one; each of the selectors corresponds to each flip-flop in a one-to-one relationship, selects and inputs an output value of the flip-flop on a previous stage to a corresponding flip-flop when the phase signal has a value representing a lead of the phase, and selects and inputs an output value of the flip-flop on a next stage to a corresponding flip-flop when the phase signal has a value representing a lag of the phase; the selector on the first stage inputs the first value as the output value of the flip-flop on the previous stage to the flip-flop on the first stage; and the selector on the last stage inputs the second value as the output value of the flip-flop on the next stage to the flip-flop on the last stage. By adopting such a structure, the priority encoder type counter can be easily realized.

Moreover, according to the present invention, when a lag of the phase is not detected by the first D flip-flop and also a lead of the phase is not detected by the second D flip-flop, the phase comparator outputs a phase signal representing a coincidence in phase between the feedback signal and the input signal; the counter comprises flip-flops and selectors, the number of flip-flops and the number of the selectors being equal to the number of bits in the control signal; each of the flip-flops outputs bit values constituting the control signal one by one; each of the selectors corresponds to each flip-flop in a one-to-one relationship, selects and inputs an output value of the flip-flop on a previous stage to a corresponding flip-flop when the phase signal has a value representing a lead of the phase, selects and inputs an output value of the flip-flop on a next stage to a corresponding flip-flop when the phase signal has a value representing a lag of the phase, and selects and inputs an output value of the corresponding flip-flop itself to a corresponding flip-flop when the phase signal has a value representing a coincidence in phase; the selector on a first stage inputs the first value as an output value of the flip-flop on the previous stage to the flip-flop on a first stage; and the selector on a last stage inputs the second value as an output value of the flip-flop on the next stage to the flip-flop on a last stage. By adopting such a structure, occurrence of overrun can be suppressed in the priority encoder type counter.

Additionally, in the present invention, the ring oscillator comprises logic gates for reversed outputs which are connected on multiple stages and in which an output from a last stage thereof is inputted to a first stage thereof and variable resistors which are provided between the logic gates and power supply voltage sources, prolongs the oscillation cycle by increasing resistance values of the variable resistors when the number of bits representing the first value is increased, and shortens the oscillation cycle by decreasing the resistance values of the variable resistors when the number of bits representing the first value is reduced. With such a structure, a propagation delay time of the logic gates can be controlled by controlling the resistances of the variable resistors.

Further, according to the present invention, the variable resistor comprises a plurality of resistors connected with each other in parallel, the number of which is equal to the number of bits in the control signal, and switching elements connected with the respective resistors in series; each switching element corresponds to each bit value constituting the control signal in a one-to-one relationship, enters a non-conductive state when a corresponding bit value is the first value and enters a conductive state when it is the second value. By adopting such a structure, the number of the conductive switching elements can be easily controlled based on the number of bits having the first value in the control signal. As a result, a propagation delay time of the logic gates can be readily controlled by controlling the resistances of the variable resistors.

Furthermore, according to the present invention, the ring oscillator comprises logic gates for reversed outputs which are connected on multiple stages and in which an output from a last stage thereof is inputted to a first stage thereof and variable capacitances which are provided between the respective logic gates and a grounded voltage source, prolongs the oscillation cycle by increasing capacitance values of the variable capacitances when the number of bits representing the first value is increased, and shortens the oscillation cycle by decreasing the capacitance values of the variable capacitances when the number of bits representing the first value is reduced. With such an arrangement, a propagation delay time of the logic gates can be controlled by controlling load capacitances of the logic gates.

Moreover, according to the present invention, the variable capacitance comprises load capacitances connected with each other in parallel, the number of which is equal to the number of bits in the control signal, and switching elements connected with the respective load capacitances in series; and each switching element corresponds to each bit value constituting the control signal in a one-to-one relationship, enters a conductive state when a corresponding bit value is the first value and enters a non-conductive state when it is the second value. By adopting such a structure, the number of the conductive switching elements can be readily controlled based on the number of bits having the first value in the control signal. As a result, a propagation delay time of the logic gates can be easily controlled by controlling the load capacitances.

Additionally, according to the present invention, the ring oscillator comprises: logic gates for reversed outputs which are connected on multiple stages in which an output from a last stage thereof is inputted to a first stage thereof; variable current sources respectively provided between the logic gates and a reference voltage source and restrict upper limits of current values; and a control circuit which prolongs the oscillation cycle by decreasing current values flowing through the variable current sources when the number of bits representing the first value in the control signal is increased, and shortens the oscillation cycle by increasing the current values flowing through the variable current sources when the number of bits representing the first value is reduced.

An output potential of the logic gate for reversed outputs such as a CMOS is determined based on a charge quantity charged in a parasitic capacitance of the logic gate. Therefore, a time required for the output potential of the logic gate to reach a threshold value can be controlled by controlling the current value flowing through the logic gate by the variable current source. Thus, a current having an upper limit value corresponding to the number of bits having the first values in the control signal is caused to flow through the logic gate by using the control circuit. As a result, a charge quantity per unit time becomes fixed. Consequently, a charge time required for the output voltage to reach a threshold value is in inverse proportion to the upper limit value of the current. However, a relationship between the upper limit value of the current and the charge time can be linearly approximated if it falls within a fixed range. Therefore, a total delay time of all the logic gates can be substantially linearly changed with respect to a change in the number of bits having the first value by varying the upper limit value within the range enabling this linear approximation and likewise slightly varying a delay time of each logic gate.

Further, according to the present invention, the control circuit comprises: constant current sources connected with each other in parallel, the number of which is equal to the number of bits in the control signal; switching elements connected with the respective constant current sources in series; a current/voltage conversion circuit which converts a total current value passed through the switching elements into a bias voltage value; and a current source bias circuit which applies a bias voltage to the variable current sources, the switching element corresponding to each of the bits values constituting the control signal in a one-to-one relationship, entering a non-conductive state when a corresponding bit value is the first value and entering a conductive state when it is the second value, and the constant current source being configured to pass a current within an upper limit value which substantially linearly responds to an increase/decrease in the bias voltage value. With such a structure, it is possible to easily produce the bias voltage value which linearly corresponds to an increase/decrease in the number of bits having the first value in the control signal. As a result, a relationship between the number of bits having the first value in the control signal and the oscillation cycle of the ring oscillator can have linear characteristics.

(DLL)

Furthermore, according to the present invention, the delay locked loop circuit (DLL) comprises: a phase comparator which receives a binary output signal and an input signal, and outputs a phase signal representing a lead or a lag of a phase of the output signal relative to the input signal; a counter which receives the phase signal, outputs a control signal, increases a value of the control signal when the phase signal has a value representing a lead of the phase, and decreases a value of the control signal when the phase signal has a value representing a lag of the phase; and a variable delay circuit which receives the control signal and the input signal, generates the output signal, prolongs a delay time of the output signal relative to the input signal when the number of values in the control signal is large, and shortens a delay time of the output signal relative to the input signal when the number of values in the control signal is small.

More specifically, according to the present invention, the phase comparator receives a binary output signal and an input signal, detects a value of the output signal in synchronization with the input signal, and outputs a detection result as a phase signal representing a lead or a lag of a phase of the output signal compared to the input signal; the counter receives the phase signal, outputs a control signal constituted of a plurality of bits respectively representing a first value or a second value, increases the number of bits representing the first value in the control signal by one when the phase signal has a value representing a lead of the phase, and decreases the number of bits representing the first value in the control signal by one when the phase signal has a value representing a lag of the phase; and the variable delay circuit receives the control signal and the input signal, outputs the output signal, prolongs a delay time of the output signal relative to the input signal when the number of bits representing the first value in the control signal is large, and shortens a delay time of the output signal relative to the input signal when the number of bits representing the first value is small.

According to the digital-controlled DLL of the present invention, a reduction in power consumption, size of a circuit scale and cost can be achieved by adopting a circuit configuration based on logic elements without using analog circuits. Furthermore, according to the DLL of the present invention, since an analog circuit whose response speed is low is not used, especially an LPF is not used, the phase can be locked with the high accuracy in a higher band. Therefore, a lock loop band can be improved. Moreover, according to the DLL of this invention, in the phase comparator, a lead and a lag of the phase are detected as values of a feedback signal in synchronization with the input signal irrespective of a phase difference. Therefore, the reliability of the phase comparison can be improved. Additionally, since the present invention uses a priority encoder type counter which increases/decreases the number of bits representing the first value in the control signal by one based on the phase signal, only a value of one bit is changed at a time in the control signal. Therefore, the reliability can be improved.

Further, in the present invention, the phase comparator comprises a D flip-flop (D-FF). When the phase comparator comprises the D-FF in this manner, a value of the feedback signal can be readily detected in synchronization with the input signal and the detected value can be held.

Further, according to the present invention, the phase comparator comprises: a first D flip-flop which detects a lag of the phase; a second D flip-flop which detects a lead of the phase; a first variable delay element which adjusts an input signal to be inputted to the first D flip-flop by an amount corresponding to a switch phase difference of an output value of the first D flip-flop which has detected a lag of the phase; and a second variable delay element which adjusts an input signal to be inputted to the second D flip-flop by an amount corresponding to a switch phase difference of an output value of the second D flip-flop which has detected a lead of the phase. With such an arrangement, reducing a skew of the first D flip-flop and the second D flip-flop by using the first and second variable delay elements can decrease hysteresis. As a result, occurrence of jitters due to overrun after phase locking can be suppressed. Furthermore, a time required for the phase to be locked can be shortened, and it is possible to cope with a higher frequency band.

Moreover, according to the present invention, the phase comparator comprises a dynamic D flip-flop and a non-dynamic D flip-flop to which an output from the dynamic D flip-flop is inputted, the dynamic D flip-flop has a structure in which dynamic latch circuits each having an analog switch combined with a parasitic capacitance are connected on two stages in a subordinate manner, and the non-dynamic D flip-flop has a structure in which latch circuits each having an analog switch combined with an inverter are connected on two stages in a subordinate manner. By inputting an output from the dynamic D flip-flop to the non-dynamic D flip-flop in this manner, a hysteresis width can be narrowed in an output from the non-dynamic D flip-flop. As a result, occurrence of jitters due to overrun after phase locking can be suppressed. Additionally, a time required for the phase to be locked can be shortened, and it is possible to cope with a higher frequency band.

Further, according to the present invention, the counter comprises flip-flops and selectors which select signals to be inputted to the flip-flops, the number of the flip-flops and the number of selectors being equal to the number of bits in the control signal. Each of the flip-flops outputs bit values constituting the control signal one by one, and each of the selectors corresponds to each flip-flop in a one-to-one relationship, selects and inputs an output value of the flip flop on a previous stage to a corresponding flip-flop when the phase signal has a value representing a lead of the phase, and selects and inputs an output value of the flip-flop on a next stage to a corresponding flip-flop when the phase signal has a value representing a lag of the phase. The selector on a first stage inputs the first value as the output value of the flip-flop on the previous stage to the flip-flop on the first stage, and the selector on a last stages inputs the second value as the output value of the flip-flop on the next stage to the flip-flop on the last stage. By adopting such a structure, a priority encoder type counter can be readily realized.

Furthermore, in the present invention, when a lag of the phase is not detected by the first D flip-flop and a lead of the phase is not detected by the second D flip-flop either, the phase comparator outputs a phase signal representing a coincidence between the output signal and the input signal. The counter comprises flip-flops and selectors which select signals to be inputted to the flip-flops, the number of the flip-flops and the number of the selectors being equal to the number of bits in the control signal. Each of the flip-flops outputs bit values constituting the control signal one by one, and each of the selector selects and inputs an output value of the flip-flop on a previous stage to a corresponding flip-flop when the phase signal has a value representing a lead of the phase, selects and inputs an output value of the flip-flop on a next stage to a corresponding flip-flop when the phase signal has a value representing a lag of the phase, and selects and inputs an output value of the corresponding flip-flop itself to a corresponding flip-flop when the phase signal has a value representing a coincidence of the phase. The selector on a first stage inputs the first value as the output value of the flip-flop on the previous stage to the flip-flop on the first stage, and the selector on the last stage inputs the output value of the flip-flop on the next stage to the flip-flop on the last stage. By adopting such a structure, occurrence of overrun can be suppressed in a priority encoder type counter.

Moreover, according to the present invention, the variable delay circuit comprises logic gates for reversed outputs which are connected on multiple stages and variable resistors provided between the logic gates and a power supply voltage source, prolongs the oscillation cycle by increasing resistance values of the variable resistors when the number of bits representing the first value is increased, and shortens the oscillation cycle by decreasing the resistance values of the variable resistors when the number of bits representing the first value is reduced. With such a structure, a propagation delay time of the logic gates can be controlled by controlling the resistances of the variable resistors.

Additionally, according to the present invention, the variable resistance circuit comprises resistors whose number is equal to the number of bits in the control signal and which are connected with each other in parallel, switching elements which are connected to the respective resistors in series. Each switching element corresponds to each bit constituting the control signal in a one-to-one relationship, enters a non-conductive state when a corresponding bit value is the first value, and enters a conductive state when it is the second value. With such an arrangement, the number of the conductive switching elements can be readily controlled based on the number of bits having the second value in the control signal. As a result, a propagation delay time of the logic gates can be easily controlled by controlling the resistances of the variable resistors.

Further, according to the present invention, the variable delay circuit comprises logic gates for reversed outputs which are connected on multiple stages, and variable capacitances provided between the respective logic gates and a grounded voltage source, prolongs the oscillation cycle by increasing capacitive values of the variable capacitances when the number of bits representing the first value is increased, and shortens the oscillation cycle by decreasing the capacitive values of the variable capacitances when the number of bits representing the first value is reduced. By adopting such a structure, a propagation delay time of the logic gates can be controlled by controlling load capacitances of the logic gates.

Furthermore, according to the present invention, the variable capacitance comprises load capacitances whose number is equal to the number of bits in the control signal and which are connected with each other in parallel, and switching elements which are connected to the respective load capacitances in series. Each switching element corresponds to each bit value constituting the control signal in a one-to-one relationship, enters a conductive state when a corresponding bit value is the first value, and enters a non-conductive state when it is the second value. With such an arrangement, the number of the conductive switching elements can be readily controlled based on the number of bits having the first value in the control signal. As a result, a propagation delay time of the logic gates can be easily controlled.

Moreover, according to the present invention, the variable delay circuit comprises: logic gates for reversed outputs which are connected on multiple stages; variable current sources each of which is provided between each logic gate and a reference voltage source and restricts an upper limit of a current value; and a control circuit which prolongs the oscillation cycle by decreasing current values flowing through the variable current sources when the number of bits representing the first value in the control signal is increased, and shortens the oscillation cycle by increasing the current values flowing through the variable current sources when the number of bits representing the first value is reduced.

An output potential of the logic gate for reversed outputs such as a CMOS is determined based on a charge quantity charged in the parasitic capacitance of the logic gate. Therefore, controlling the current value flowing through the logic gate by using the variable current source can control a time required for the output potential of the logic gate to reach a threshold value. Thus, the control circuit passes a current having an upper limit value corresponding to the number of bits having the first value in the control signal to the logic gate. As a result, a charge quantity per unit time becomes fixed. Consequently, a charge time required for an output voltage to reach a threshold value is in inverse proportion to the upper limit value of the current. However, a relationship between the upper limit value of the current and the charge time can be linearly approximated if it falls within a fixed range. Therefore, a total delay time of all the logic gates can be substantially linearly changed with respect to a change in the number of bits having the first value by varying the upper limit in this range enabling linear approximation and likewise slightly varying the delay time of each of the logic gates.

Additionally, according to the present invention, the control circuit comprises: constant current sources whose number is equal to the number of bits in the control signal and which are connected with each other in parallel; switching elements which are connected to the respective constant current sources in series; a current/voltage conversion circuit which converts a total current value which has passed through the switching elements into a bias voltage value; and a current source bias circuit which applies a bias voltage to the variable current sources. The switching element corresponds to each bit value constituting the control signal in a one-to-one relationship, enters a non-conductive state when a corresponding bit value is the first value, and enters a conductive state when it is the second value. The constant current source passes a current within the upper limit value which substantially linearly responds to an increase/decrease in the bias voltage value. With such an arrangement, it is possible to readily produce a bias voltage value linearly corresponding to an increase/decrease in the number of bits having the first value in the control signal. As a result, a relationship between the number of bits having the first value in the control signal and a delay time of the variable delay circuit can have linear characteristics.

(Timing Generator)

Further, according to the present invention, the timing generator comprises: a delay locked loop circuit including a variable delay circuit in which logic gates on multiple stages are connected in series; and a delay selector which selects an output from any of the logic gates and outputs it as a delay signal. The delay locked loop circuit comprises: a phase comparator which receives a binary output signal and an input signal, detects a value of the output signal in synchronization with the input signal, and outputs a detection result as a phase signal representing a lead or a lag of a phase of the output signal compared to the input signal; a counter which receives the phase signal, outputs a control signal constituted of a plurality of bits each of which represents a first value or a second value, increases the number of bits representing the first value in the control signal by one when the phase signal has a value representing a lead of the phase, and decreases the number of bits representing the first value in the control signal by one when the phase signal has a value representing a lag of the phase; and the variable delay circuit which receives the control signal and the input signal, generates the output signal, prolongs a delay time of the output signal relative to the input signal when the number of bits representing the first value in the control signal is large, and shortens the delay time of the output signal relative to the input signal when the number of bits representing the first value is small. According to such a timing generator, a reduction in power consumption, size of a circuit scale and cost can be achieved by using a digitally-controlled DLL having a circuit configuration based on logic elements without using analog circuits.

Furthermore, according to the DLL of the present invention, since an analog circuit whose response speed is low is not used, especially an LPF is not used, the phase can be locked with the high accuracy in a higher frequency band.

Moreover, according to timing generation of the present invention, in the phase comparator of the DLL, a lead and a lag of the phase are detected as values of a feedback signal in synchronization with the input signal irrespective of a phase difference. Therefore, the reliability of phase comparison can be improved.

Additionally, in the present invention, since a priority encoder type counter which increases/decreases the number of bits representing the first value in the control signal by one based on the phase signal is used for the DLL, only a value of one bit is changed at a time in the control signal. Therefore, the reliability can be improved.

Further, according to the present invention, a delay time of an output signal outputted from the logic gate on the last stage in the variable delay circuit is longer than a maximum delay time of a delay signal outputted from the logic gate selected by the delay selector. In the DLL, the output signal outputted from the logic gate on the last stage is fed back and phase-locked. Therefore, the accuracy of the DLL is determined as an error of the delay time of the output signal outputted from the last stage. Thus, by providing the logic gates on more stages than those of the logic gates sufficient for generating the maximum delay time used by the timing generator, the maximum delay time which is actually used becomes shorter than the delay time of the output signal outputted from the last stage. As a result, an error of the maximum delay time becomes smaller than an error of the delay time of the last stage. For example, by providing the logic gates whose number corresponds to the delay time which is m-fold (m is a positive integer) of the maximum delay time to be used, an error of the maximum delay time to be used can be reduced to 1/m of an error of the delay time outputted from the last stage. Therefore, the error can be decreased, and the practical accuracy can be improved.

(Semiconductor Test Instrument)

Furthermore, according to the present invention, there is provided a semiconductor test instrument comprising: a timing generator which outputs a delay clock signal obtained by delaying a reference clock signal for a predetermined time; a pattern generator which outputs a test pattern signal in synchronization with the reference clock signal; a waveform shaper which shapes the test pattern signal in accordance with a test target device and inputs the test pattern signal to the test target device; and a logic comparator which compares a response output signal of the test target device with the expected value data signal, wherein the timing generator comprises: a delay locked loop circuit including a variable delay circuit in which logic gates on multiple stages are connected with each other in series; and a delay selector which selects an output of any one of the logic gate and outputs it as a delay signal, the delay locked loop circuit comprises: a phase comparator which receives a binary output value and an input signal, detects a value of the output signal in synchronization with the input signal, and outputs a detection result as a phase signal representing a lead or a lag of a phase of the output signal compared to the input signal; a counter which receives the phase signal, outputs a control signal constituted of a plurality of bits each of which represents a first value or a second value, increases the number of bits representing the first value in the control signal by one when the phase signal has a value representing a lead of the phase, and decreases the number of bits representing the first value in the control signal by one when the phase signal has a value representing a lag of the phase; and the variable delay circuit which receives the control signal and the input signal, outputs the output signal, prolongs a delay time of the output signal relative to the input signal when the number of bits representing the first value in the control signal is large, and shortens the delay time of the output signal relative to the input signal when the number of bits representing the first value is small.

According to such a timing generator of the present invention, by using a digitally-controlled DLL having a circuit configuration based on logic elements without utilizing analog circuits, a reduction in power consumption, size of a circuit configuration and cost can be achieved. Moreover, according to the DLL of the present invention, since an analog circuit whose response speed is low is not used, especially an LPF is not used, the phase can be locked with the high accuracy in a higher frequency band. Additionally, according to timing generation of the present invention, in the phase comparator of the DLL, a lead and a lag of the phase are detected as values of a feedback signal in synchronization with the input signal irrespective of a phase difference. Therefore, the reliability of phase comparison can be improved. Further, in the present invention, since a priority encoder type counter which increases/decreases the number of bits representing the first value in the control signal by one based on the phase signal is used for the DLL, only value of one bit is changed at a time in the control signal. Therefore, the reliability can be improved.

(Semiconductor Integrated Circuit)

Further, according to the present invention, there is provided a semiconductor integrated circuit comprising: a plurality of phase-locked loop circuit having oscillation frequencies equal to each other; and wirings which distribute a reference clock signal having a frequency lower than the oscillation frequencies to each phase-locked loop circuit, wherein the phase-locked loop circuit comprises: a frequency divider which divides an output signal as a binary signal and outputs a feedback signal as a binary signal; a phase comparator which receives the feedback signal and the reference clock signal, detects a value of the feedback signal in synchronization with the reference clock signal, and outputs a detection result as a phase signal representing a lead or a lag of a phase of the feedback signal compared to the input signal; a counter which receives the phase signal, outputs a control signal constituted of a plurality of bits each representing a first value or a second value, increases the number of bits representing the first value in the control signal by one when the phase signal has a value representing a lead of the phase, and decreases the number of bits representing the first value in the control signal by one when the phase signal has a value representing a lag of the phase; and a ring oscillator which receives the control signal, outputs the output signal, prolongs an oscillation cycle of the output signal when the number of bits representing the first value in the control signal is large, and shortens the oscillation cycle of the output signal when the number of bits representing the first value is small.

According to such a semiconductor integrated circuit of the present invention, since a plurality of digitally-controlled PLLs which have a small power consumption and can be reduced in size are provided, a clock signal having a low frequency with a small skew can be inputted to each PLL, and an operating clock having a high frequency can be self-oscillated in each PLL. As a result, a relay buffer for the clock signal is no longer necessary, the skew of the clock signal can be reduced, and designing can be facilitated.

BRIEF DESCRIPTION OF THE DRAWINGS

FIG. 3 is an explanatory view illustrating a method for changing bit values in a control signal;

FIG. 25(A) is a graph showing a relationship between a PLL circuit phase comparison circuit and a VCO voltage, and (B) is a graph showing a relationship between the VCO voltage and a VCO self-oscillation cycle;

FIG. 27(A) is a graph showing a relationship between a DLL circuit phase comparison circuit and a DELAY voltage, and (B) is a graph showing a relationship between the DELAY voltage and a delay time.

BEST MODE FOR CARRYING OUT THE INVENTION

In order to explain the present invention in more detail, embodiments according to the present invention will be described hereinafter with reference to the accompanying drawings.

First Embodiment

First, an example of a phase-locked loop circuit (PLL) according to the present invention will be described as a first embodiment.

Figure 1:
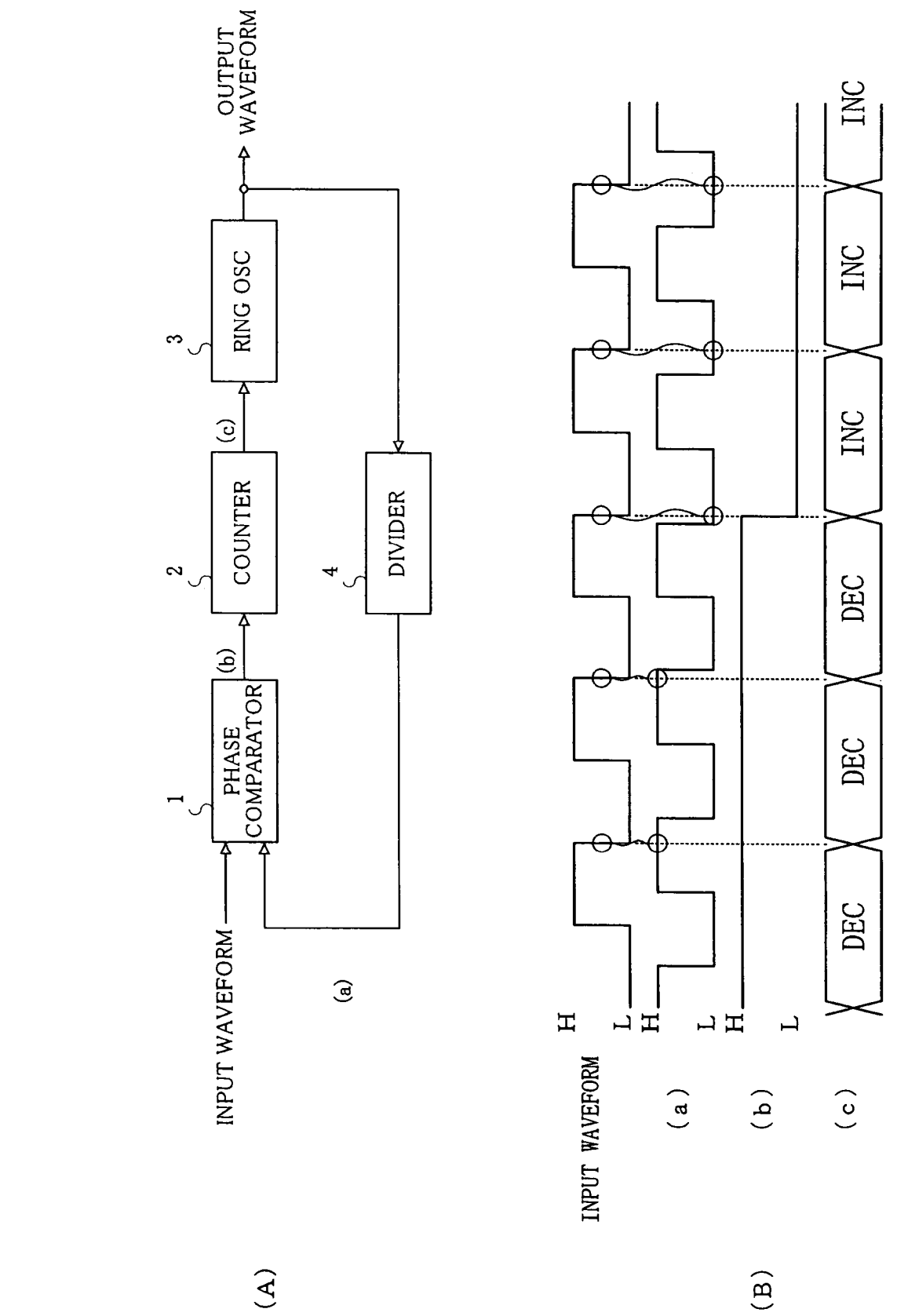
FIG. 1(A) is a block diagram illustrating a structure of a PLL according to a first embodiment of the present invention, and (B) is a timing chart illustrating its operation.

As shown in FIG. 1(A), a PLL according to the first embodiment comprises a phase comparator 1, a counter 2, a ring oscillator (RING OSC) 3, and a frequency divider 4. Further, in the PLL, an output signal (output waveform) as a binary signal of the ring oscillator 3 is divided by the frequency divider 4, and inputted to the phase comparator 1 as a feedback signal as a binary signal which is "H" or "L".

To the phase comparator 1 is inputted an input signal (input waveform) together with the feedback signal. Then, the phase comparator 1 detects a value of the feedback signal in synchronization with the input signal. In this embodiment, as shown in FIG. 1(B), the phase comparator 1 samples a value of the feedback signal with a timing of a trailing edge of the input signal.

Subsequently, the phase comparator 1 outputs a detection result as a phase signal representing a lead or a lag of a phase of the feedback signal relative to the input signal. In the example shown in FIG. 1(B), "H" representing a lag of the phase is detected in the first two samplings, and "L" representing a lead of the phase is detected in the remaining three samplings. That is, a value of the feedback signal as a detection result is utilized as a phase signal representing a lead or a lag of the phase as it is.

Then, the sampled value is held until the next sampling timing. In the example shown in FIG. 1(B), the phase signal (b) outputted from the phase comparator 1 holds "H" until the third sampling is performed, and holds "L" after the third sampling. Furthermore, the phase signal outputted from the phase comparator 1 is inputted to the counter 2.

It is to be noted that the sampling is carried out with the timing of the trailing edge of the input signal in this embodiment, but the sampling may be carried out with a timing of, e.g., a leading edge of the input signal. In this case, a detection value representing a lead of the phase becomes "H", and a detection value representing a lag of the phase becomes "L".

The counter 2 outputs a control signal constituted of a plurality of bits. Each bit is indicative of "H" or "L". The counter 2 has a function of a priority encoder, and each bit value of the control signal is controlled by using the phase signal.

That is, when the phase signal has a value representing a lead of the phase, the counter 2 performs addition measurement (INC) to increase the number of bits representing "H" in the control signal by one. In this case, the number of bits representing "L" is decreased by one. On the other hand, when the phase signal has a value representing a lag of the phase, the counter 2 performs subtraction measurement (DEC) to decrease the number of bits representing "H" in the control signal by one. In this case, the number of bits representing "L" is increased by one. Then, the control signal is inputted to the ring oscillator 3.

The ring oscillator 3 receives the control signal and outputs an output signal. Moreover, the ring oscillator 3 lowers a self-oscillation frequency as the number of bits representing "H" is large and the number of bits representing "L" is small in the control signal. That is, it prolongs an oscillation cycle of the output signal.

On the other hand, the ring oscillator 3 increases the self-oscillation frequency as the number of bits representing "H" is small and the number of bits representing "L" is large in the control signal. That is, it shortens the oscillation cycle of the output signal.

A further concrete structural example of the PLL according to the present invention will now be described with reference to FIG. 2.

In the phase comparator 1 according to the present invention, detecting only a lead or a lag of the phase can suffice, and a magnitude of a phase difference does not have to be detected. Therefore, the phase comparator 1 can have a simple structure like a D flip-flop (D-FF) 10. The D-FF 10 can be used to readily detect a value of the feedback signal ("H" or "L") in synchronization with the input signal, and hold it. Additionally, an output from the D-FF 10 can be inputted to the counter 2 as a phase signal.

The counter 2 comprises flip-flops 21 (21-1 to 21-39) on 39 stages which is equal to the number of bits in the control signal, and selectors 22 (22-1 to 22-39) on 39 stages. Each flip-flop 21 outputs bit values q1 to q39 which are to constitute the control signal one by one. Further, each selector 22 corresponds to each flip-flop 21 in a one-to-one relationship, and selects a signal to be inputted to a corresponding flip-flop 21.

It is to be noted that an example in which the control signal is formed of 39 bits will be explained in this embodiment, but the number of bits in the control signal is not restricted thereto.

When the phase signal is "H" representing a lag of the phase, each selector 22 selects an output value of the flip-flop 21 on a next stage and inputs it to a corresponding flip-flop 21. For example, the selector 22-2 on the second stage selects an output value of the flip-flop 21-3 on the third stage, and inputs it to the flip-flop 21-2 on the second stage.

On the other hand, when the phase signal is "L" representing a lead of the phase, each selector selects an output value of the flip-flop on a previous stage, and inputs it to a corresponding flip-flop. For example, the selector 22-2 on the second stage selects an output value of the flip-flop 21-1 on the first stage, and inputs it to the flip-flop 21-2 on the second stage.

However, the selector 22-1 on the first stage inputs "H" which is a first value to the flip-flop 21-1 on the first stage as an output value of the flip-flop on the previous stage. Furthermore, the selector 22-39 on the last stage (39th stage) inputs "L" which is a second value to the flip-flop 21-39 on the last stage as an output value of the flip-flop on the next stage.

As a result, the number of bits representing "H" in the control signal is increased by one when the phase signal is "H" and, on the other hand, the number of bits representing "L" in the control signal is decreased by one when the phase signal is "L".

Here, FIG. 3 showing an example in which the number of bits representing "H" in the control signal is increased/decreased based on a value of the phase signal. FIG. 3 corresponds to the timing chart of FIG. 1(B). It is to be noted that "H" is represented as "1" and "L" is represented as "0" in FIG. 3.

In the example shown in FIG. 3, it is assumed that values of leading four bits are "1" and values of remaining respective bits are "0". Therefore, the number of bits having "1" in the control signal is "4".

Then, as shown in FIG. 1(B), a value of the detected phase signal (phflag) is "H" in the first sampling. Therefore, the number of bits representing "1" in the control signal is decreased by one. That is, a bit value of the fourth bit from the top is changed from "1" to "0". At this moment, values of the respective bits other than this are not changed. Therefore, only the values of the leading three bits are "1". It is to be noted that the changed bits are encircled with a bold line in FIG. 3.

Then, a value of the phase signal is likewise "H" in the second sampling. Therefore, the number of bits representing "1" in the control signal is further decreased by one. That is, a bit value of the third bit from the top is newly changed from "1" to "0". At this moment, values of the respective bits other than this are not changed. Therefore, only the values of the leading two bits are "1".

Subsequently, a value of the detected phase signal is "L" in the third sampling. Therefore, the number of bits representing "1" in the control signal is increased by one. That is, a bit value of the third bit from the top is changed from "0" to "1". At this moment, values of the respective bits other than this are not changed. Therefore, values of the leading three bits are "1".

Then, a value of the detected phase signal is likewise "L" in the fourth sampling. Therefore, the number of bits representing "1" in the control signal is further increased by one. That is, a bit value of the fourth bit from the top is newly changed from "0" to "1". At this moment, values of the respective bits other than this are not changed. Therefore, only values of the leading four bits are "1".

Then, a value of the detected phase signal is likewise "L" in the fifth sampling. Therefore, the number of bits representing "1" in the control signal is further increased by one. That is, a bit value of the fifth bit from the top is newly changed from "0" to "1". At this moment, values of the respective bits other than this are not changed. Therefore, values of the leading five bits are "1".

Thereafter, the bit values in the control signal are likewise changed one by one in accordance with a value of the phase signal. The counter 2 functions as a priority encoder in this manner.

Then, the control signal generated in the counter 2 is inputted to the ring oscillator 3.

It is to be noted that the counter 2 in this embodiment is a priority encoder type counter which increases/decreases the number of bits representing "H" in the control signal by one in accordance with the phase signal, and hence only a value of one bit is changed at a time in the control signal. Therefore, the reliability can be improved.

The ring oscillator 3 is configured to connect logic gates for reversed outputs to the odd-numbered stages in series and input an output from the last stage to the first stage. In this embodiment, the logic gate on each stage comprises an inverter 30 of a CMOS circuit.

Moreover, in the ring oscillator 3 according to this embodiment, variable resistors 31 are provided between the inverter 30 and power supply voltage sources Vdd and Vss. The variable resistor 31 comprises resistors whose number is equal to the number of bits in the control signal and which are connected with each other in parallel, and switching elements which are connected with the respective resistors in series. Here, a transistor is provided as the switching element, and an ON-resistance of the transistor is utilized as the variable resistance.

Additionally, each transistor corresponds to each bit value constituting the control signal in a one-to-one relationship. That is, each bit value in the control signal is applied to a gate electrode of the transistor. As a result, a conductive state is achieved when a corresponding bit value is "L", and a non-conductive state is attained when it is "H".

However, a reversed bit value of the control signal is inputted to the gate electrode of each transistor provided between the inverter and the power supply voltage Vdd.

Figure 2:
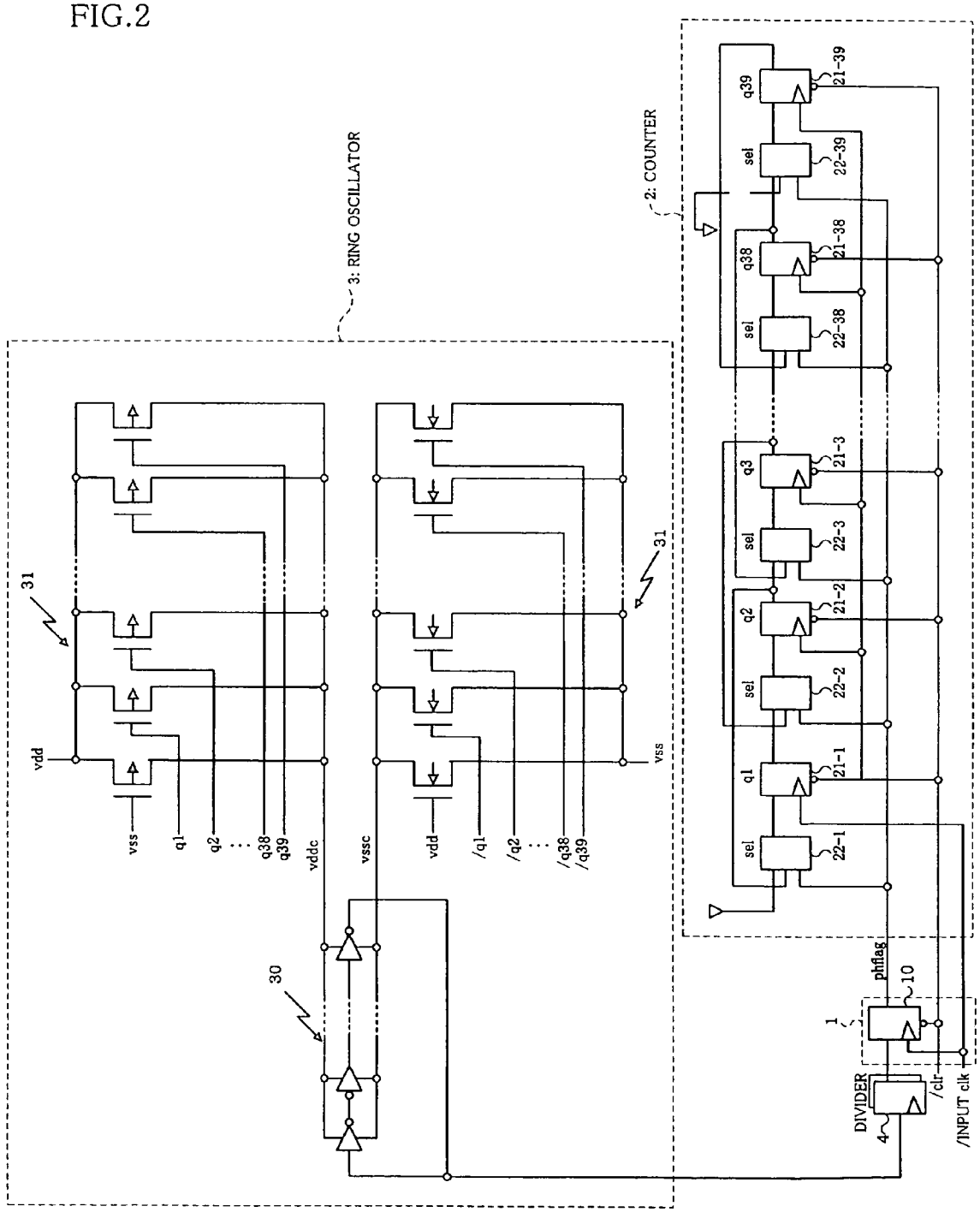
FIG. 2 is a circuit diagram showing a concrete example of the PLL according to the first embodiment of the present invention.

It is to be noted that wirings to lead each bit signal in the control signal to the gate electrode of each transistor in the ring oscillator 3 from each flip-flop of the counter 2 are eliminated in FIG. 2.

With such a structure, the number of the switching elements in the conductive state can be readily controlled based on the number of bits representing "H" in the control signal. Further, as indicated by a curved line I in FIG. 4, a resistance value of the variable resistor formed of the transistors connected with each other in parallel is lowered as the number of conductive transistors in the transistors is increased. Therefore, a propagation delay time of the logic gate can be readily controlled by controlling the on resistance of the variable resistor.

As a result, a resistance value of the variable resistor is increased and the oscillation cycle is prolonged when the number of bits representing "H" as the first value in the control signal is increased, and the resistance value of the variable resistor is decreased and the oscillation cycle is shortened when the number of bits representing "H" in the control signal is reduced.

As described above, according to the digital-controlled PLL of this embodiment, by providing the circuit configuration based on logic elements without using analog circuits, a reduction in power consumption, size in a circuit scale and cost can be achieved.

Furthermore, according to the PLL of the present invention, since an analog circuit whose response speed is low is not used, especially an LPF is not used, the phase can be locked with the high accuracy in a higher band. Therefore, a lock loop band can be improved.

Second Embodiment

Figure 5:
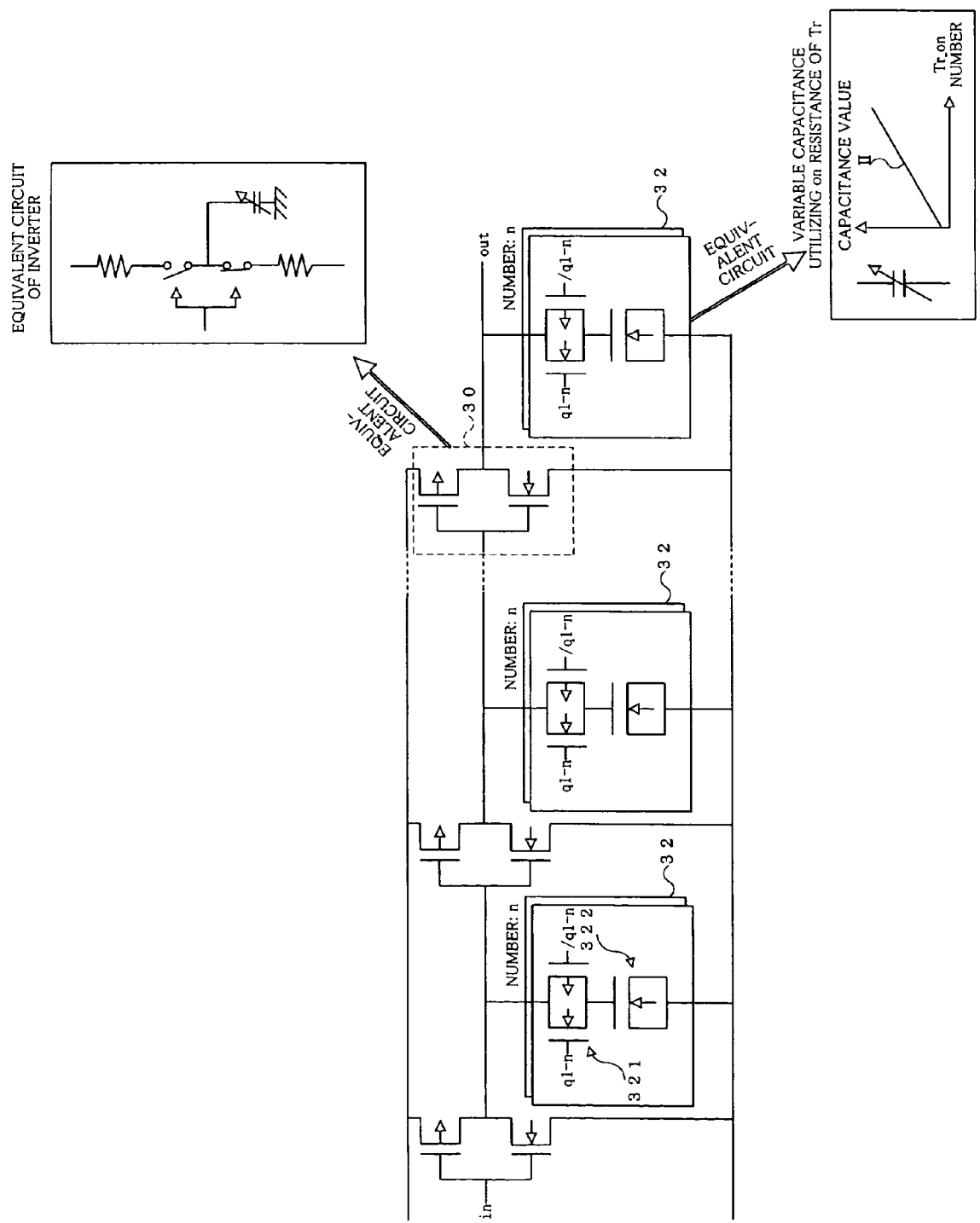
FIG. 5 is an explanatory view of delay time setting by a variable capacitance in a second embodiment according to the present invention.

Another example of the PLL according to the present invention will now be described as a second embodiment with reference to FIG. 5.

In the second embodiment, respective constituent components other than the ring oscillator 3 are the same as those in the above-described first embodiment, thereby eliminating their explanation.

The ring oscillator 3 according to the second embodiment comprises inverters 30 connected in series on multiple stages like the first embodiment. Moreover, it comprises variable capacitances 32 provided between the respective inverters 30 and a grounded voltage source.

Additionally, the respective variable capacitances 32 comprise load capacitances 322 whose number is equal to the number of bits in the control signal and which are connected with each other in parallel, and switching elements 321 which are connected with the respective load capacitances 322 in series.

Here, a gate capacitance of the transistor is utilized as the load capacitance. Further, a transfer gate is provided as the switching element. Furthermore, each transfer gate corresponds to each bit value constituting the control signal in a one-to-one relationship. That is, each bit value in the control signal is applied to the gate electrode of the transfer gate. As a result, a conductive state (ON) is achieved when a corresponding bit value is "H", and a non-conductive state (OFF) is attained when it is "L".

Therefore, when the number of bits representing "H" in the control signal is increased, a capacitance value of the variable capacitance 32 is increased, and the oscillation cycle of the ring oscillator 3 is prolonged. On the other hand, when the number of bits representing "H" in the control signal is decreased, a capacitance value of the variable capacitance 322 is reduced, and the oscillation cycle of the ring oscillator 3 is shortened.

With such an arrangement, the number of the conductive switching elements can be easily controlled based on the number of bits representing "H" in the control signal. Additionally, as indicated by a curved line II in FIG. 4, the capacitance values of the variable capacitances comprising the load capacitances connected with each other in parallel become high as the number of conductive transfer gates in all the transfer gates is increased. Therefore, a propagation delay time of the logic gates can be readily controlled by controlling the load capacitances.

Third Embodiment

Still another example of the PLL according to the present invention will now be described as a third embodiment.

Like the above-described first and second embodiments, the digital-controlled PLL can reduce a cycle clock number required until feedback is applied after passing a lock target as compared with a conventional analog-controlled PLL. As a result, a loop lock band can be increased.

Figure 6:
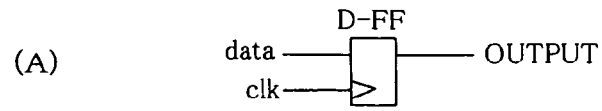
FIGS. 6(A), (B) and (C) are explanatory views of hysteresis of a D flip-flop, and (D) is an explanatory view of a time resolution of feedback.
Figure 6:
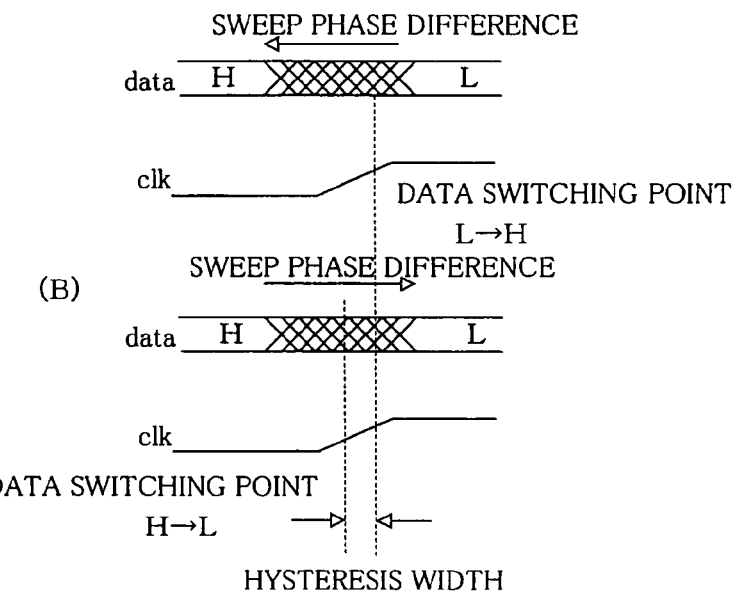
Figure 6:
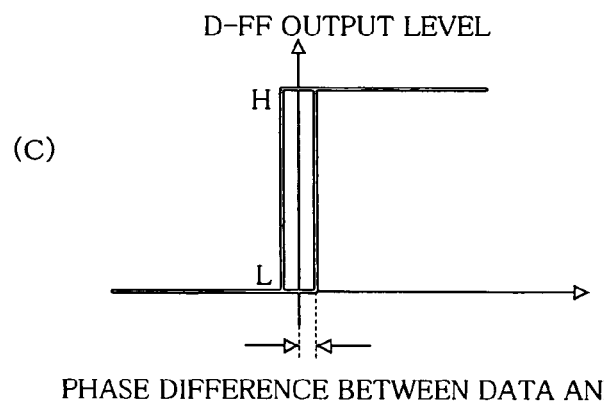
Figure 6:
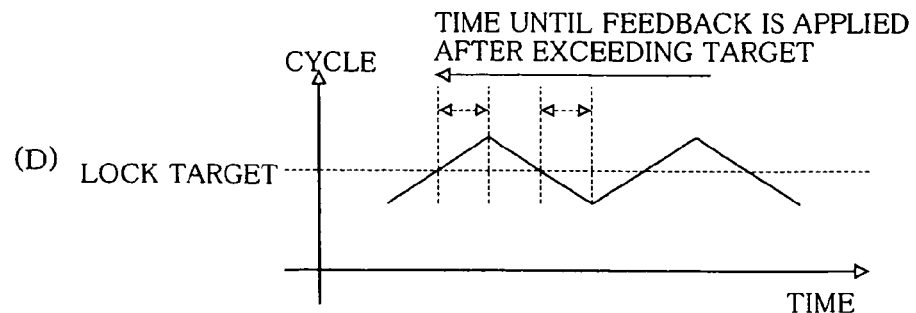

Meanwhile, in a D flip-flop such as shown in FIG. 6(A), a phase difference when an output value is switched from "H" to "L" from a timing to detect a division signal such as shown in FIG. 6(B) may not be necessarily equal to a phase difference when the output value is switched from "L" to "H" in some cases.

In such a case, as shown in FIG. 6(C), there may be generated hysteresis that a phase difference between a feedback signal such as a data signal and an input signal such as a clock signal differs depending on a change direction of an output value of the D flip-flop. In particular, when a time resolution of the variable delay circuit is smaller than a width of this hysteresis, a lag corresponding to several cycles may occur in order to exceed the width of the hysteresis.

Further, a lag may be generated for a recovery time period or a write time with a next clock due to metastable properties of the D flip-flop.

When these lags are generated, a time required until the feedback is applied after an oscillation frequency exceeds a lock target becomes long as shown in FIG. 6(D). As a result, the phase locking accuracy is lowered, which can be an obstacle to an increase in frequency band.

Figure 7:
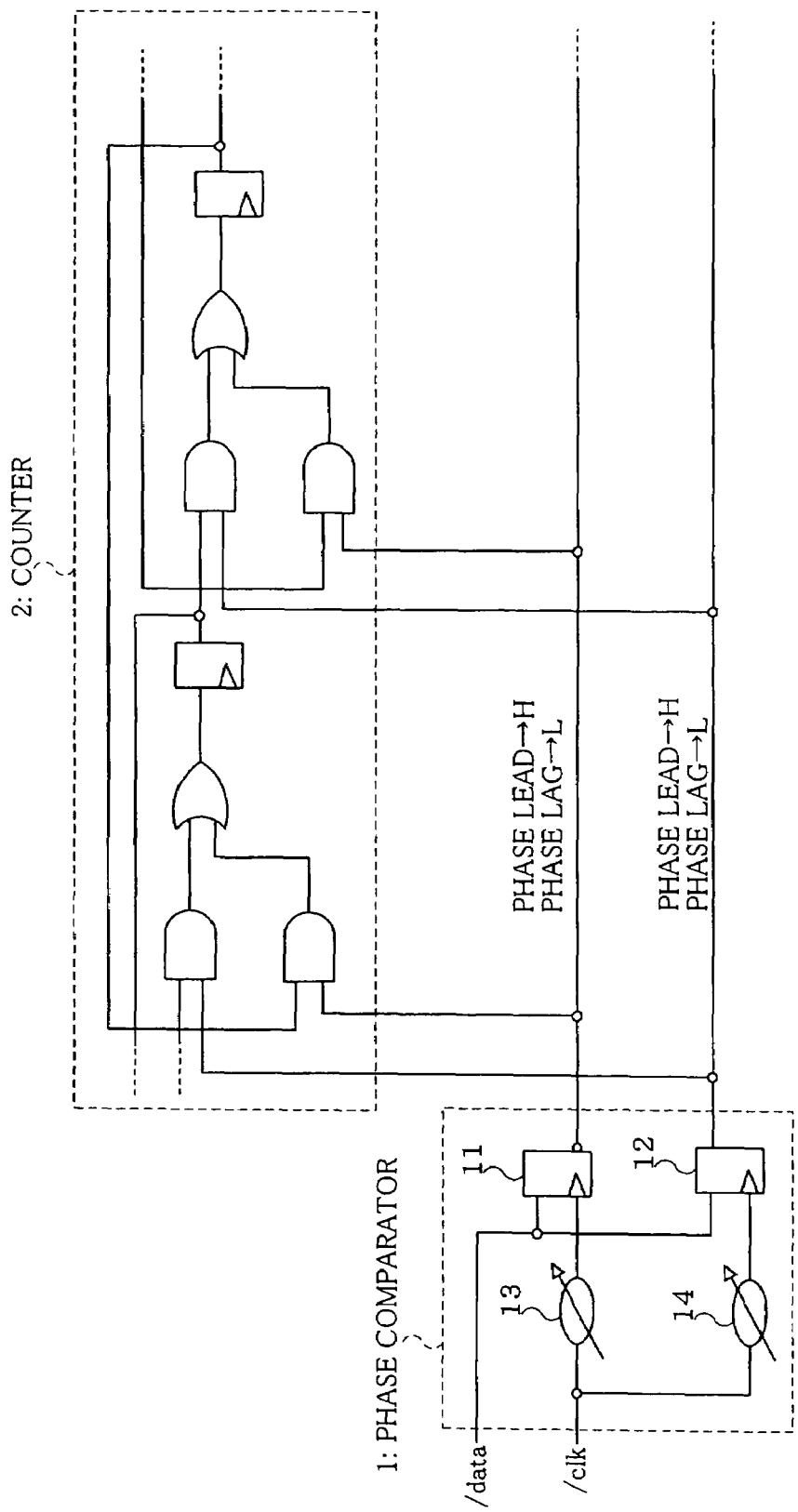
FIG. 7 is a circuit diagram of a phase comparator and a counter according to a third embodiment of the present invention.

Thus, in the third embodiment, as shown in FIG. 7, in the PLL, the phase comparator 1 comprises a first D flip-flop (first D-FF) 11, a second D flip-flop (second D-FF) 12, a first variable delay element 13 and a second variable delay element 14.

The first D-FF 11 detects "H" of the feedback signal. Then, the first variable delay element 13 adjusts an input signal to be inputted to the first D-FF 11 by an amount corresponding to a switch phase difference of an output value of the first D-FF 11. On the other hand, the second D-FF 12 detects "L" of the feedback signal. Furthermore, the second variable delay element 14 adjusts an input signal to be inputted to the second D-FF 12 by an amount corresponding to a switch phase difference of an output value of the second D-FF 12.

By canceling out the switch phase difference of the first D-FF 11 by using the first variable delay element 13 and canceling out the switch phase difference of the second D-FF by using the second variable delay element 14 in this manner, the hysteresis of the D-FF can be reduced. As a result, a time required for the phase to be locked can be shortened, and it is possible to cope with a higher frequency band.

It is to be noted that the structures of the phase comparator 1 and the counter 2 described in the third embodiment can be preferably used in the delay locked loop circuit according to the present invention.

Fourth Embodiment

Yet another example of the PLL according to the present invention will now be described as a fourth embodiment with reference to FIG. 8.

Figure 8:
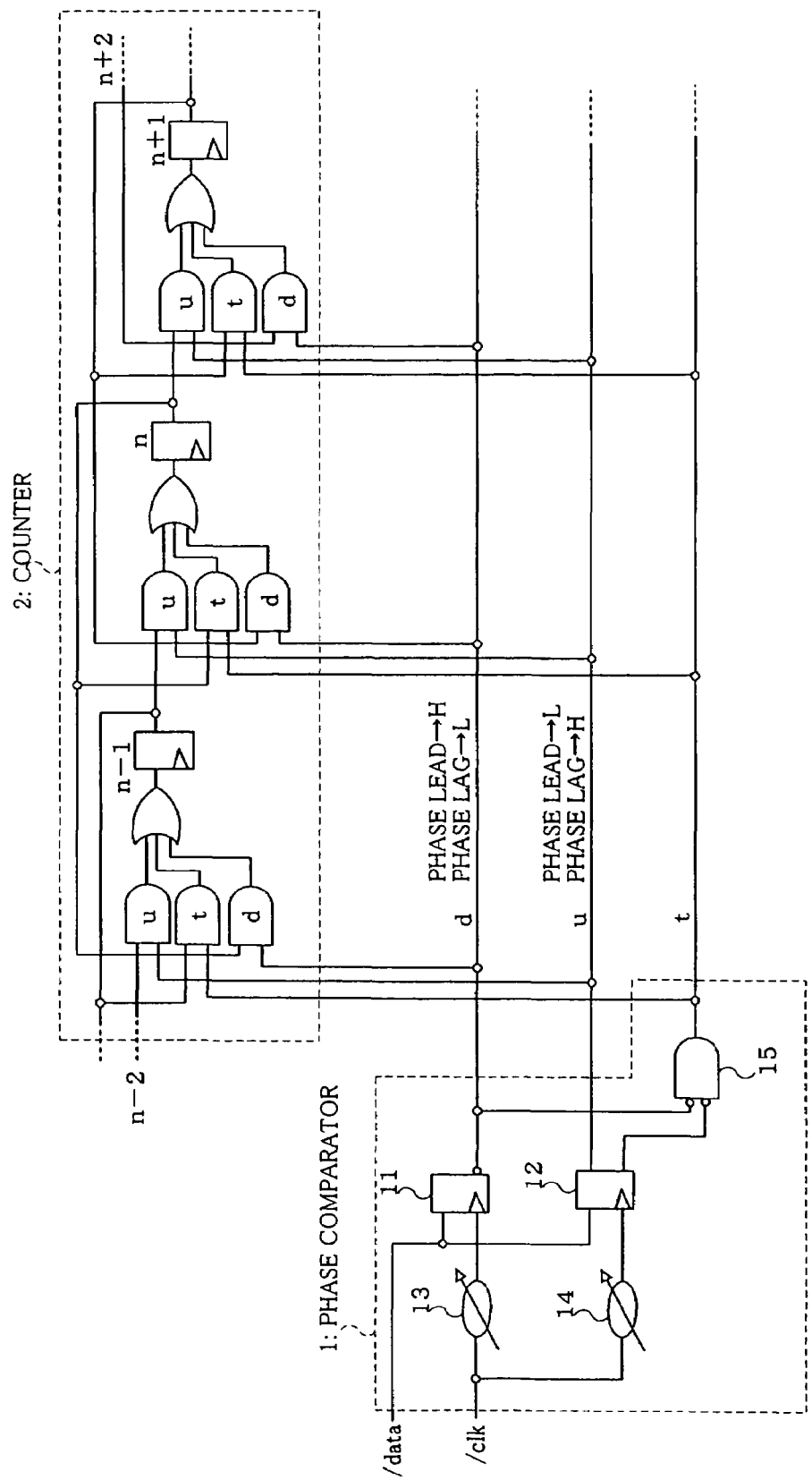
FIG. 8 is a circuit diagram of a phase comparator and a counter according to a fourth embodiment of the present invention.

In the phase comparator 1 shown in FIG. 8, an AND circuit 15 is provided in addition to the structure of the phase comparator in the third embodiment mentioned above. To this AND circuit 15 are inputted reversed outputs from the first D-FF 11 and the second D-FF 12. When a lag of the phase is not detected by the first D flip-flop 11 and also a lead of the phase is not detected by the second D flip-flop 12, the AND circuit 15 outputs a phase signal t indicative of a coincidence in phase between the feedback signal and the input signal.

Incidentally, in this case, it is good enough to slightly provide a phase width which is a difference between the switch phase difference of the output value of the first D flip-flop 11 and the switch phase difference of the output value of the second flip-flop 12, i.e., a hysteresis width of the phase comparator 1 by using the first and second variable delay elements 13 and 14 of the phase comparator 1. Moreover, when the phase difference between the feedback signal and the input signal is smaller than this hysteresis width, the phase signal t indicative of a coincidence in phase is outputted.

Figure 9:
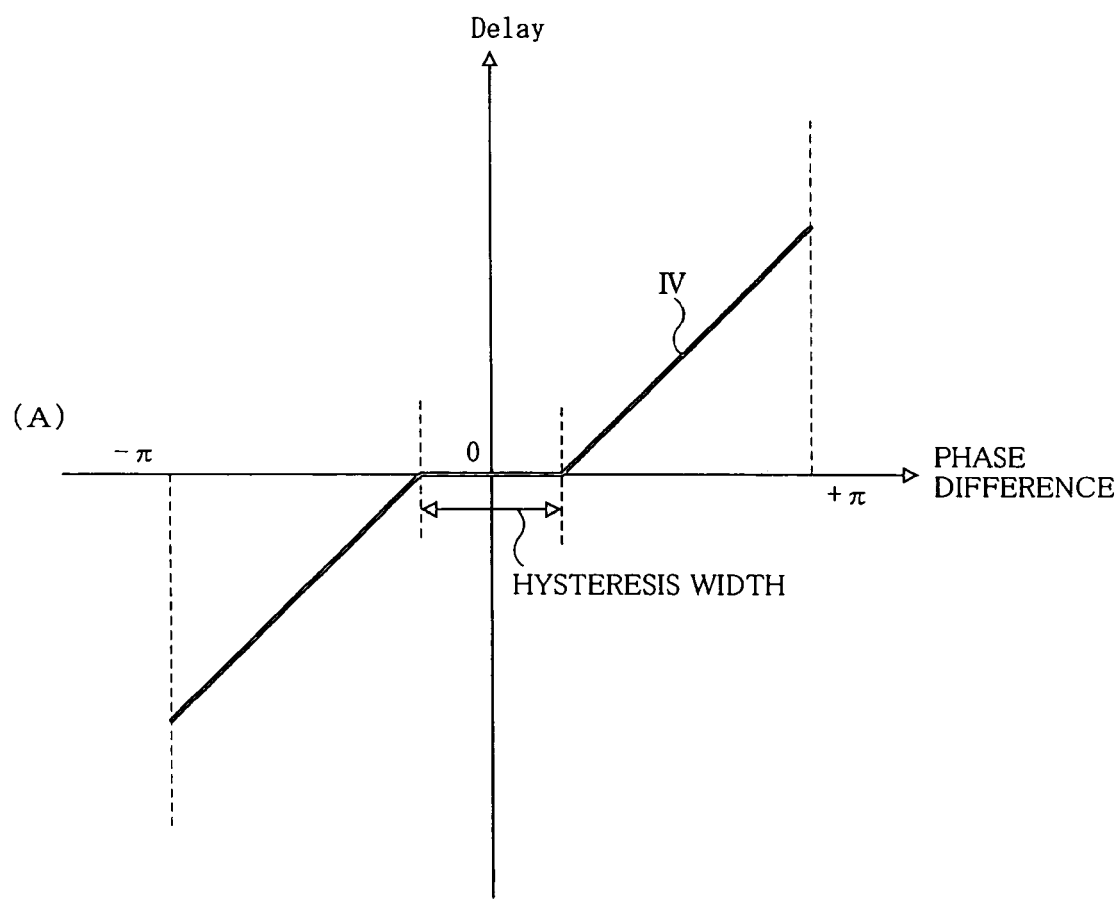
FIG. 9 is a graph showing a relationship between a phase and a VCO (DELAY) voltage in the fourth embodiment according to the present invention.

In this case, a relationship between the phase and the VCO (DELAY) voltage is represented by, e.g., a curved line IV in a graph shown in FIG. 9. It is desirable to adjust this hysteresis width by an amount corresponding to a delay resolution of a VCO and the like or adjust it so as to be an approximately jitter quantity of the clock signal by using the first and the second variable delay elements 13 and 14, for example.

Additionally, the counter 2 in this embodiment has a structure in which an output value of a corresponding flip-flop itself is selected and inputted to a corresponding flip-flop when the phase signal outputted from the phase comparator 1 has a value indicative of a coincidence in phase in addition to the structure of the counter 2 in the first embodiment shown in FIG. 2.

As a result, in the priority encoder type counter, occurrence of overrun can be suppressed.

Incidentally, it is also preferable to use the structures of the phase comparator 1 and the counter 2 described in the third embodiment to the delay locked loop circuit according to the present invention.

Fifth Embodiment

A further embodiment of the PLL according to the present invention will now be described as a fifth embodiment.

Figure 10:
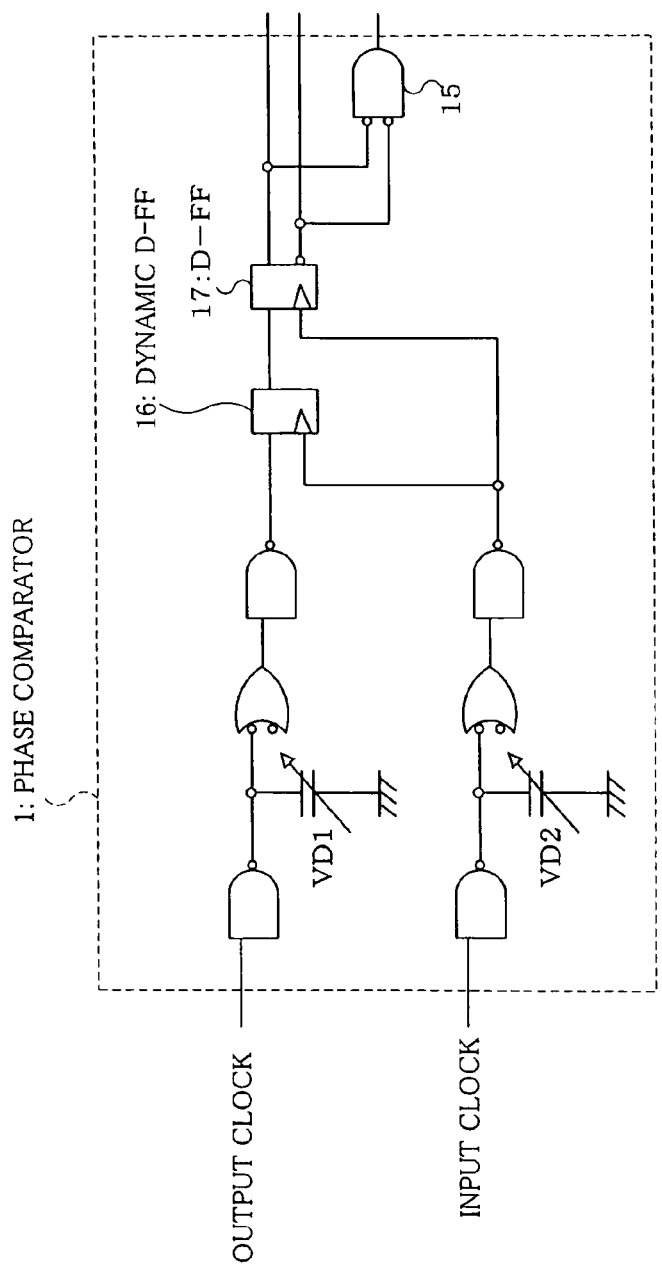
FIG. 10 is a circuit diagram of a phase comparator according to a fifth embodiment of the present invention.

As shown in FIG. 10, the phase comparator 1 according to the fifth embodiment comprises a dynamic D-FF 16 and a general static D-FF 17 connected in a subordinate manner. The dynamic D-FF 16 receives an output clock signal (feedback signal) and this signal is latched by an input clock signal. Further, the static D-FF 17 receives an output from the dynamic D-FF 16 and this signal is latched by an input clock signal.

Furthermore, skews of the output clock signal and the input clock signal are adjusted by using variable delay capacitances VD1 and VD2. Moreover, in the circuit of the phase comparator 1 shown in FIG. 10, a power supply voltage VDD is applied to one input terminal of an NAND circuit.

Additionally, in this embodiment, a T flag is provided so as to avoid malfunctions even if values of the output signals from the phase comparator 1 become the same level. However, when levels of both an output signal "u" and a reversed output signal "d" from the D-FF 17 become "H", the counter 2 perform counting up by priority. Thus, the T flag is provided aiming at a case in which these levels become "L". Reversed signals obtained from the output signal "u" and the reversed output signal "d" are thus inputted to the AND circuit 15. Furthermore, the AND circuit 15 outputs an output signal "t" to the counter 2.

Figure 11:
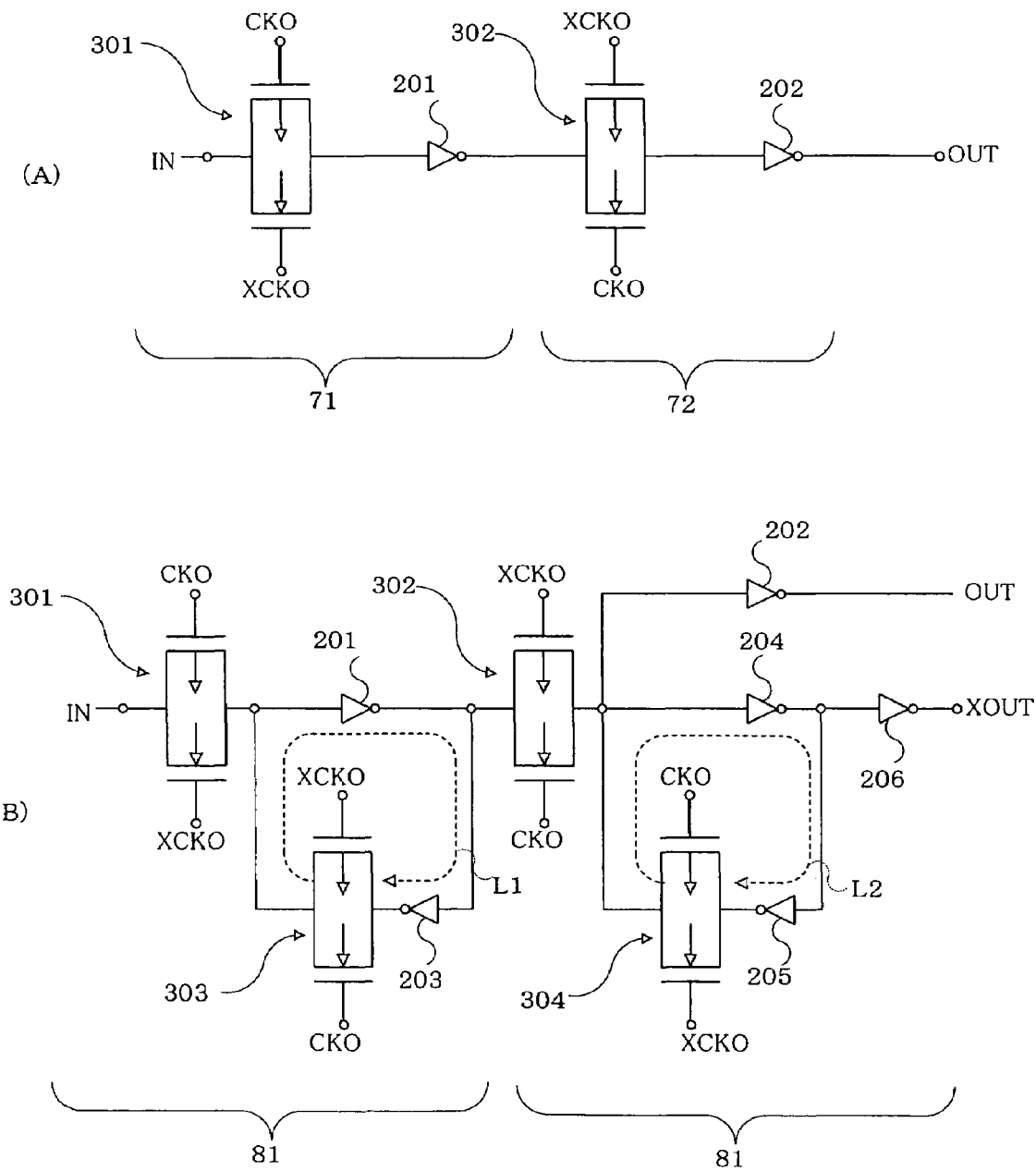
FIG. 11(A) is an equivalent circuit diagram of a dynamic D flip-flop, and (B) is an equivalent circuit diagram of a general D flip-flop.

Here, FIGS. 11(A) and (B) show equivalent circuits of the dynamic D-FF 16 and the regular static D-FF 17, respectively.

As shown in FIG. 11(A), the equivalent circuit of the dynamic D-FF 16 comprises dynamic latch circuits 71 and 72 on two stages which are connected with each other in series. The dynamic latch circuits 71 and 72 on the respective stages comprise analog switches 301 and 302 each of which is constituted of a CMOS transistor, and capacitors.

An input clock signal CKO and a reversed input clock signal XCKO are applied to a gate terminal of each of the CMOS circuits 301 and 302.

Here, the capacitor means a sum of, e.g., gate capacitances of inverters 201 and 202 constituting the dynamic latch circuits 71 and 72 on the respective stages and a parasitic capacitance or the like generated between a signal wiring and a substrate.

On the contrary, the equivalent circuit of the regular static D-FF 17 comprises latch circuits 81 and 82 on two stages which are connected with each other in series as shown in FIG. 11(B). The latch circuits 81 and 82 on the respective stages comprise analog switches 301 to 304 each of which is constituted of a CMOS transistor, and inverters 201 to 205.

An output from the latch circuit 81 on a front stage is held by a loop circuit L1 comprising the inverter 201, the inverter 203 and the CMOS transistor 303. Furthermore, an output from the latch circuit 82 on the rear stage is held by a loop circuit L2 comprising the inverter 204, the inverter 205 and the CMOS transistor 304.

Figure 12:
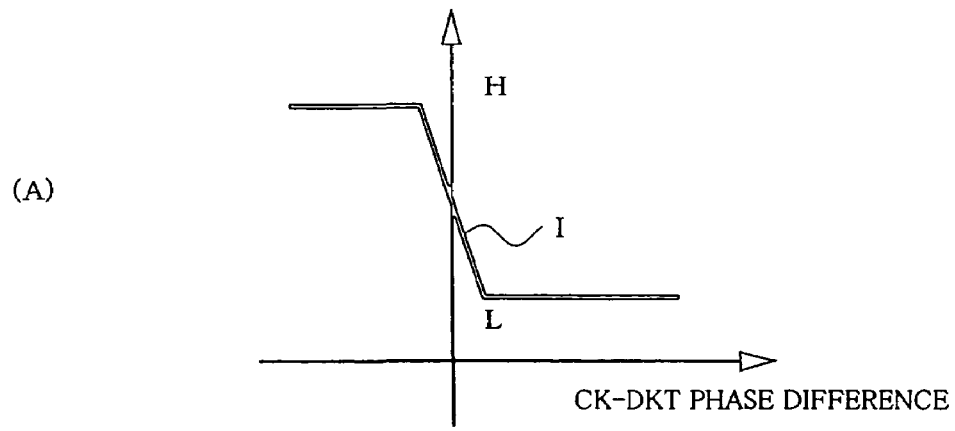
FIGS. 12(A) to (C) are explanatory views of hysteresis.
Figure 12:
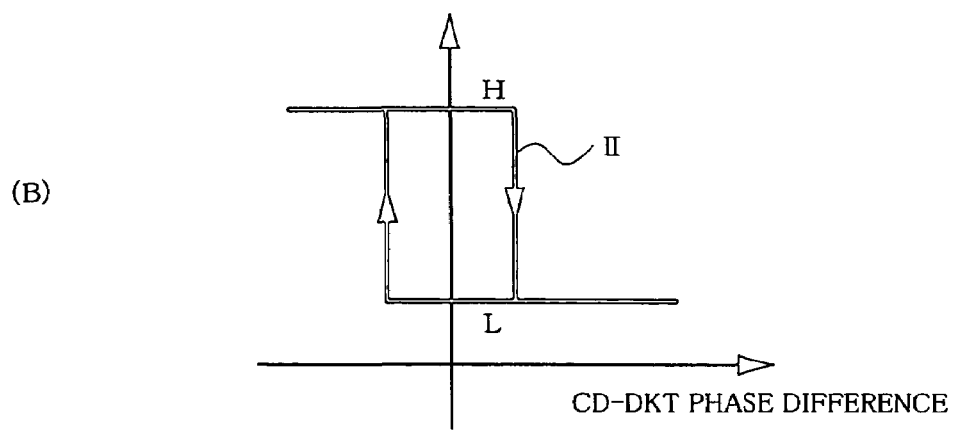
Figure 12:
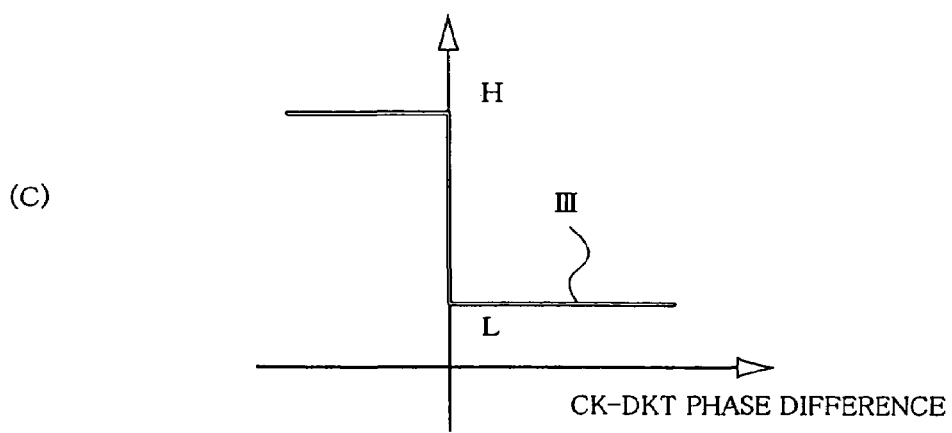

The hysteresis of the phase comparator 1 in the fifth embodiment will now be described with reference to FIG. 12.

Characteristics of the dynamic D-FF are first indicated by a curved line I in FIG. 12(A).

The dynamic D-FF 16 does not have a loop circuit. Therefore, in the dynamic D-FF 16, when electric charges are not sufficiently charged, a level of a logic output becomes an intermediate level between the "H" level and the "L" level. When a value of a sample hold becomes the intermediate level, an operation of the inverter is imperfect. Therefore, as indicated by the curved line I, a latch output also becomes an intermediate level between logic levels H and L at a part where a phase difference between the output clock signal (DAT) and the input clock signal (CK) is close to zero. However, a phase width which provides the intermediate level is very narrow.

Now, characteristics of the general static D-FF are indicated by a curved line II in FIG. 12(B).

Since the general static D-FF provides forward feedback amplification, hysteresis is generated due to a relationship with a threshold potential or a previously latched level in case of the intermediate level.

Thus, characteristics of the static D-FF when an output from the dynamic D-FF is inputted to the static D-FF are indicated by a curved line III in FIG. 12(C).

When a logic output from the dynamic D-FF on the front stage is on a determined level "H" or "L", this level is propagated to the static D-FF on the rear stage as it is. On the contrary, when a logic output from the dynamic D-FF on the front stage is on the intermediate level, the hysteresis is generated due to the forward feedback amplification of the static D-FF.

However, since a width of this hysteresis is such a width that the logic output from the static D-FF on the front stage becomes the intermediate level, it is very narrow as indicated by the curved line III.

It is to be noted that a part of the curved line III is superimposed on a vertical axis in the graph of FIG. 12(C) since the hysteresis width is very narrow.

By connecting the dynamic D-FF 16 with the static D-FF 17 in the subordinate manner as described above, the hysteresis width of the logic output from the phase comparator 1 can be narrowed. Therefore, it is possible to reduce a probability that values of the output signal "u" and the reversed output signal "d" inputted to the counter 2 from the phase comparator 1 become the same level or the intermediate level. As a result, a time required for the phase to be locked can be shortened, and it is possible to cope with a higher frequency band.

Incidentally, it is preferable to use the structure of the phase comparator 1 described in the fifth embodiment to the delay locked loop circuit according to the present invention.

Sixth Embodiment

An example of the DLL according to the present invention will now be described as a sixth embodiment.

Figure 13:
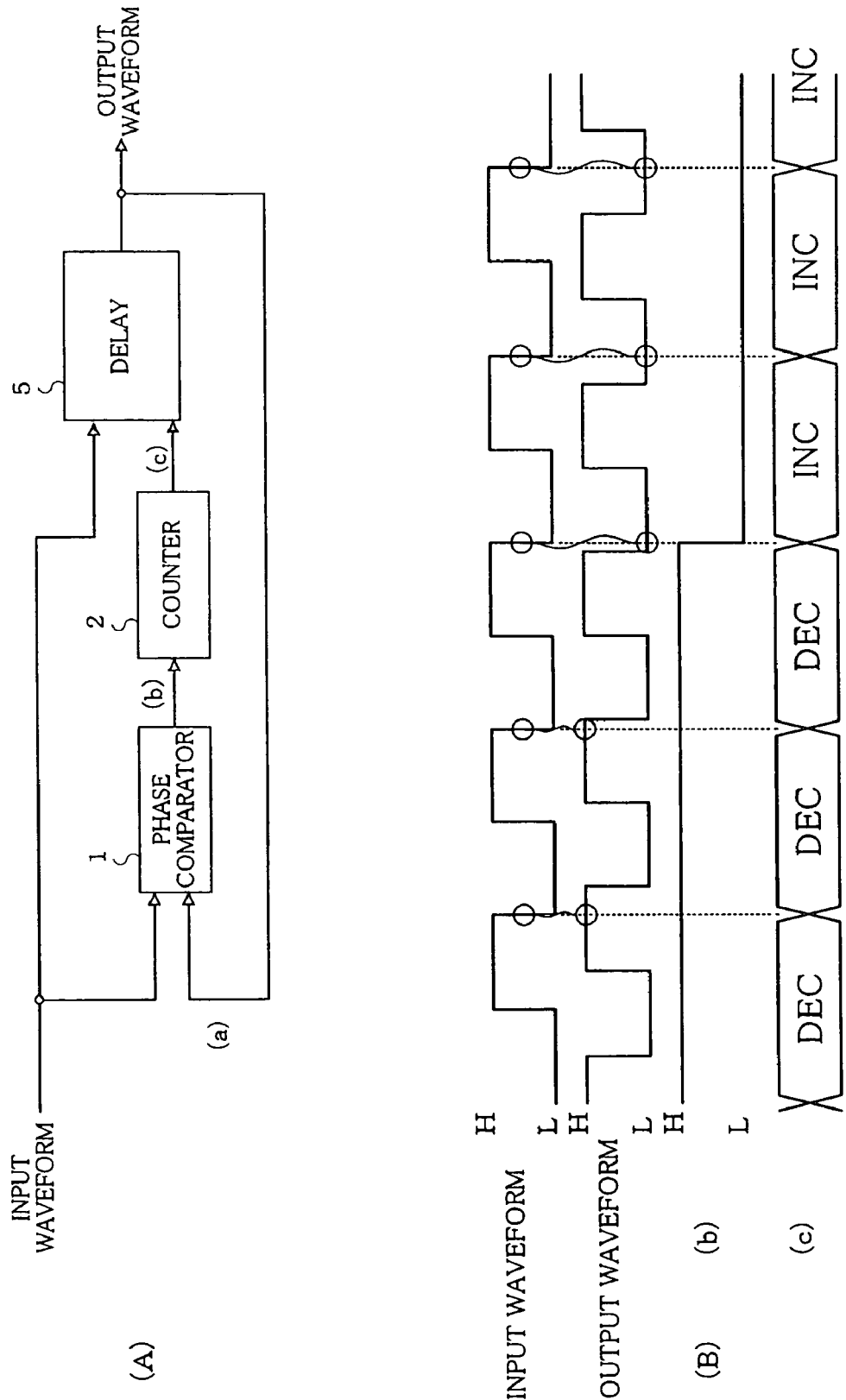
FIG. 13(A) is a block diagram illustrating a structure of a DLL according to a sixth embodiment of the present invention, and (B) is a timing chart illustrating its operation.

As shown in FIG. 13(A), a DLL according to the sixth embodiment comprises a phase comparator 1, a counter 2 and a variable delay circuit (DELAY) 5.

Further, an input signal and an output signal from the variable delay circuit 5 are inputted to the phase comparator 1. This output signal takes a value of "H" or "L". The phase comparator 1 detects a value of the output signal in synchronization with the input signal. In this embodiment, as shown in FIG. 13(B), the phase comparator 1 samples a value of the feedback signal with a timing of a trailing edge of the input signal.

Then, the phase comparator 1 outputs a detection result as a phase signal indicative of a lead or a lag of a phase of the output signal to the input signal. In the example shown in FIG. 13(B), "H" is detected in the first two samplings, and "L" is detected in the remaining three samplings. That is, a value of the output signal as a detection result is utilized as a phase signal indicative of a lead or a lag of the phase as it is.

Furthermore, the sampled value is held until the next sampling timing. In the example shown in FIG. 13(B), as to a phase signal (b) outputted from the phase comparator 1, "H" is held until the third sampling is performed, and "L" is held after the third sampling. Moreover, the phase signal outputted from the phase comparator 1 is inputted to the counter 2.

It is to be noted that the sampling is carried out with a timing of a trailing edge of the input signal in this embodiment, the sampling may be conducted with a timing of a leading edge of the input signal, for example.

The counter 2 outputs a control signal constituted of a plurality of bits. Each bit represents "H" or "L". The counter 2 has a function of a priority encoder, and each bit value in the control signal is controlled by using the phase signal.

That is, when the phase signal has a value representing a lead of the phase, the counter 2 performs addition measurement (INC) to increase the number of bits representing "H" in the control signal by one. In this case, the number of bits representing "L" is decreased by one. On the other hand, when the phase signal has a value representing a lag of the phase, the counter 2 perform subtraction measurement (DEC) to decrease the number of bits representing "H" in the control signal by one. In this case, the number of bits representing "L" is increased by one.

Then, the control signal is inputted to the variable delay circuit 5.

It is to be noted that the first value is "H" and the second value is "L" in this example, the first value may be "L" and the second value may be "H".

Furthermore, the variable delay circuit 5 receives the control signal and the input signal, and outputs an output signal. Moreover, the variable delay circuit 5 prolongs a delay time of the output signal to the input signal as the number of bits indicative of "H" in the control signal is large. On the other hand, the variable delay circuit 5 shortens the delay time of the output signal to the input signal as the number of bits indicative of "H" in the control signal is small.

A further concrete structure of the DLL according to this embodiment will now be described with reference to FIG. 14.

In the phase comparator 1 according to the present invention, since only a lead or a lag of the phase is detected and a magnitude of a phase difference does not have to be detected, a structure of the phase comparator 1 can be simplified.

Accordingly, in this embodiment, the phase comparator 1 is constituted of a D flip-flop (D-FF) 10. By constituting the phase comparator 1 of the D-FF 10 in this manner, a value of the output signal ("H" or "L") can be readily detected and held in synchronization with the input signal.

The counter 2 has the same structure as that of the counter 2 in the above-described first embodiment. Therefore, in this embodiment, the detailed explanation of the counter 2 is eliminated.

In the variable delay circuit 5, logic gates for reversed outputs on a plurality of stages are connected with each other in series. In this embodiment, the logic gate on each stage is constituted of an inverter 30 of a CMOS circuit.

Moreover, in the variable delay circuit according to this embodiment, variable resistors 31 are provided between the inverters 30 and power supply voltage sources Vdd and Vss. The variable resistor 31 comprises resistors whose number is equal to the number of bits in the control signal and which are connected with each other in parallel, and switching elements connected with the respective resistors in series. Here, transistors are provided as the switching elements, and on resistances of the transistors are utilized as resistances.

Additionally, each transistor corresponds to each bit value constituting the control signal in a one-to-one relationship. That is, each bit value of the control signal is applied to a gate electrode of the transistor. As a result, a conductive state is achieved when a corresponding bit value is "L", and a non-conductive state is attained when it is "H".

However, a reversed bit value of the control signal is inputted to the gate electrode of each transistor provided between the inverter and the power supply voltage Vdd.

Figure 14:
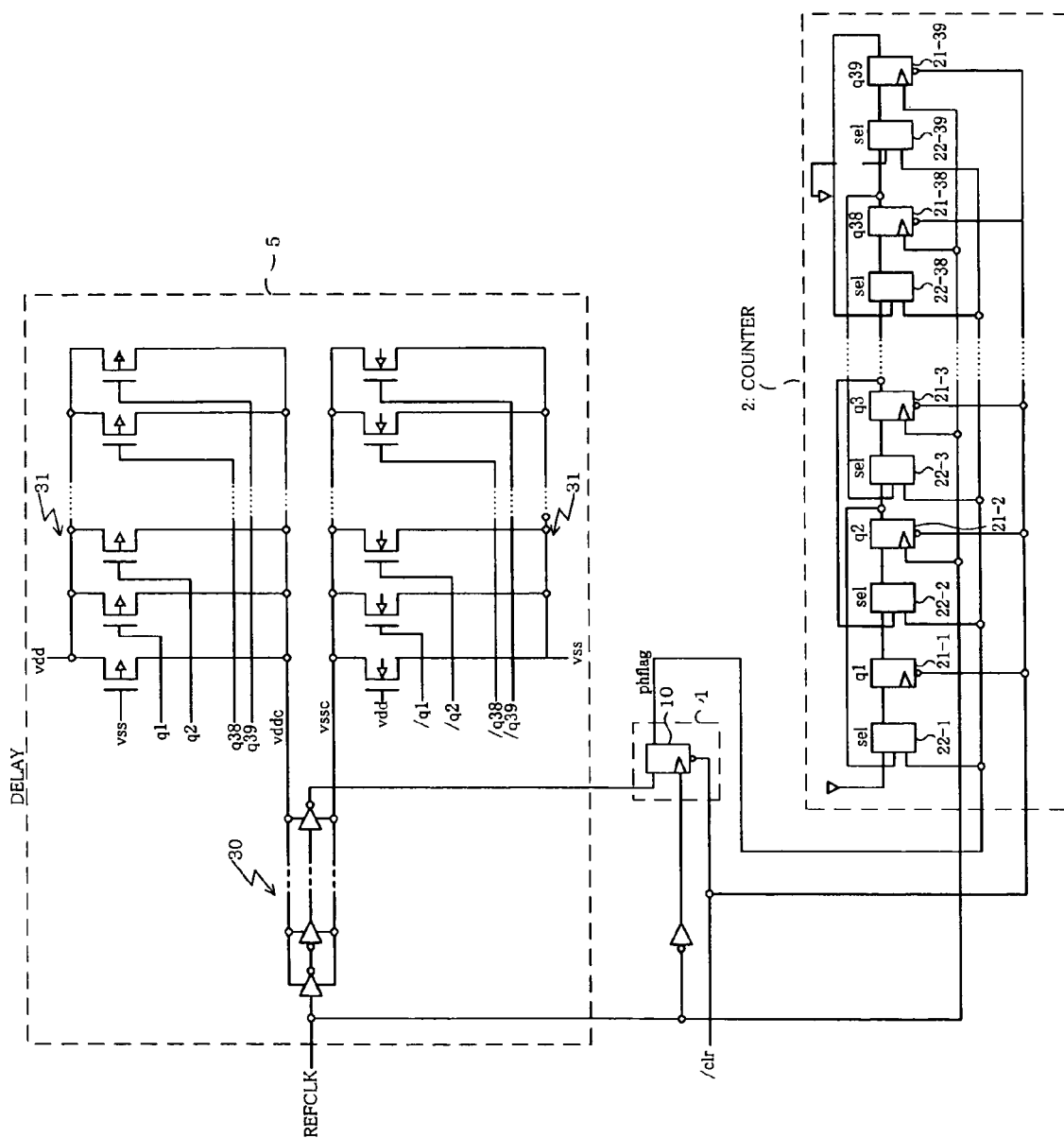
FIG. 14 is a circuit diagram showing a concrete example of the DLL according to the sixth embodiment of the present invention.

It is to be noted that the illustration of wirings which lead each bit signal of the control signal to the gate electrode of each transistor in the ring oscillator 3 from each flip-flop of the counter 2 is eliminated in FIG. 14.

By adopting such a structure, the number of the conductive switching elements can be readily controlled based on the number of bits representing "H" in the control signal. As a result, a propagation delay time of the inverters can be easily controlled by controlling the on resistances of the variable resistors.

As described above, according to the digitally-controlled DLL of this embodiment, a reduction in power consumption, size of a circuit scale and cost can be achieved by providing the circuit configuration based on logic elements without using analog circuits. Additionally, according to the DLL of this embodiment, since an analog circuit whose response speed is low is not used, especially an LPF is not use, the phase can be locked with the high accuracy in a higher frequency band. Therefore, a lock loop band can be improved.

It is to be noted that the delay time of the variable delay circuit is controlled based on the variable resistance in this embodiment, but the delay time may be controlled based on the variable load like the above-described second embodiment.

Seventh Embodiment

An example of a timing generator and a semiconductor test instrument including this timing generator will now be described as a seventh embodiment.

Figure 15:
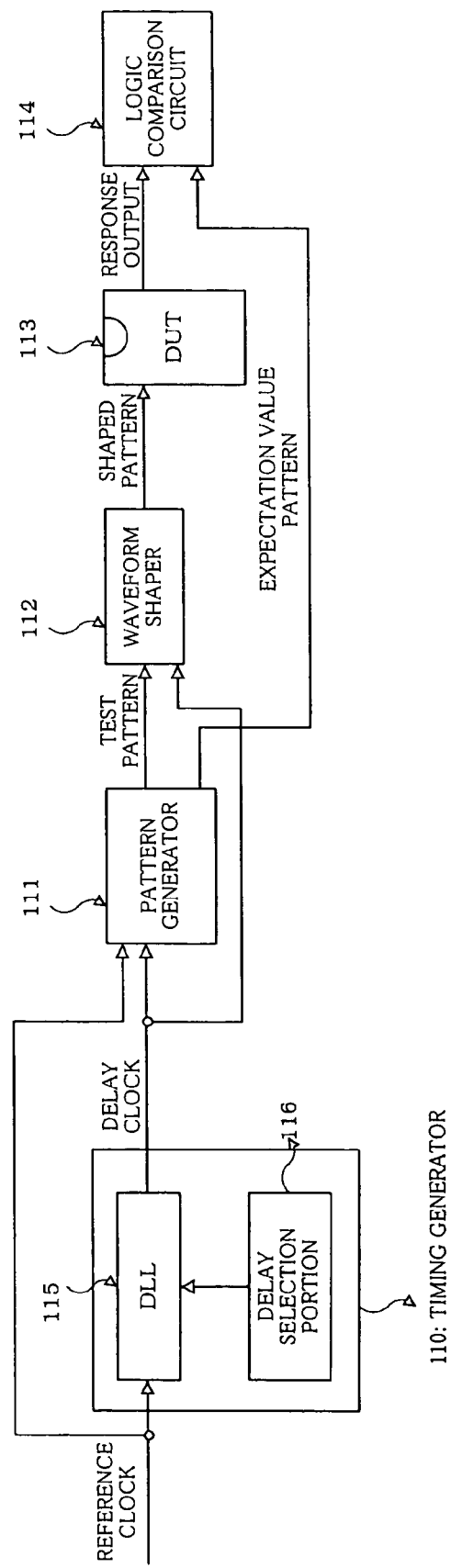
FIG. 15 is a block diagram illustrating a structure of a semiconductor test instrument according to a seventh embodiment of the present invention.

As shown in FIG. 15, the semiconductor test instrument according to this embodiment comprises a timing generator 110, a pattern generator 111, a waveform shaper 112, and a logic comparison circuit 114.

The timing generator 110 outputs a delay clock signal obtained by delaying a reference clock signal for a predetermined time. The pattern generator 111 outputs a test pattern signal in synchronization with the reference clock signal. The waveform shaper 112 shapes the test pattern signal in accordance with a test target device (DUT) 13, and inputs a result to the DUT 113. The logic comparator 14 compares a response output signal of the DUT 113 with an expected value data signal.

Further, a delay locked loop circuit (DLL) 115 and a delay selector 116 are provided to the timing generator 110 according to this embodiment.

Figure 16:
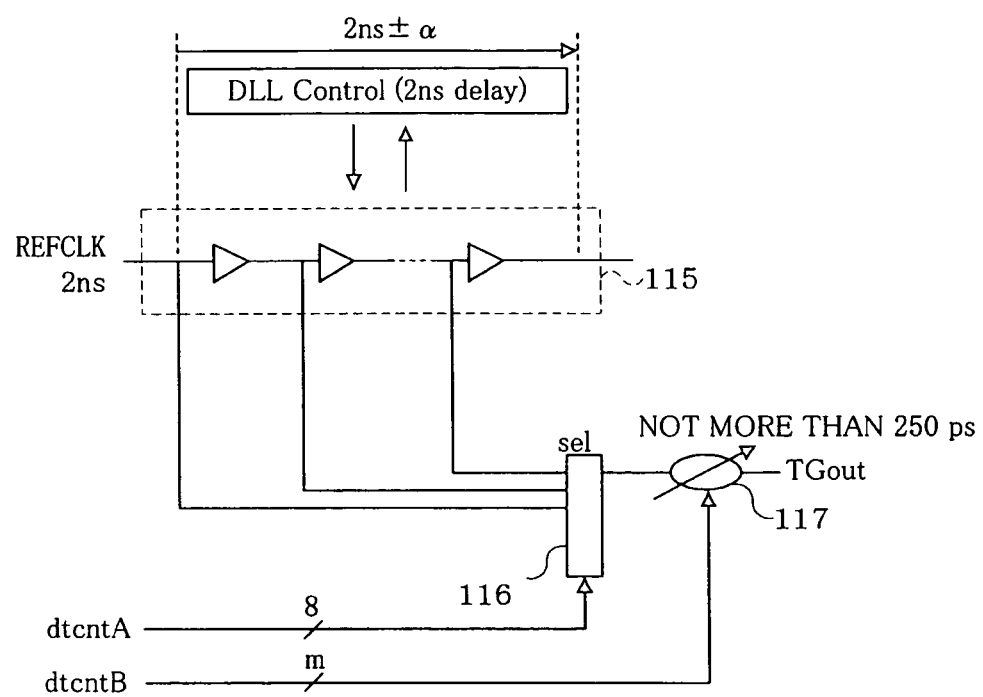
FIG. 16 is a block diagram illustrating a structure of a timing generator according to the seventh embodiment of the present invention.

Here, FIG. 16 schematically shows a structure of the timing generator 110 according to this embodiment. The DLL 115 has the same structure as that of the DLL in the seventh embodiment, and includes a variable delay circuit in which logic gates on a plurality of stages are connected with each other in series. However, an input waveform in the seventh embodiment corresponds to the reference clock signal in this embodiment.

Furthermore, the delay selector 116 selects an output from any inverter and outputs it as a delay signal. Moreover, in the example shown in FIG. 16, there is provided a delay element 117 which produces a delay time which is not more than 250 ps.

In this manner, a digitally-controlled DLL 115 having a circuit configuration based on logic elements is used for the timing generator 110 instead of an analog circuit. As a result, a reduction in power consumption, a reduction in size of a circuit scale and a reduction in cost can be achieved in the timing generator 110, and realization of a higher frequency band can be also attained.

Moreover, using the timing generator 110 constituted of such a digitally-controlled DLL 115 can reduce power consumption of the semiconductor test instrument, realize a higher frequency band, and improve the reliability.

Eighth Embodiment

Figure 17:
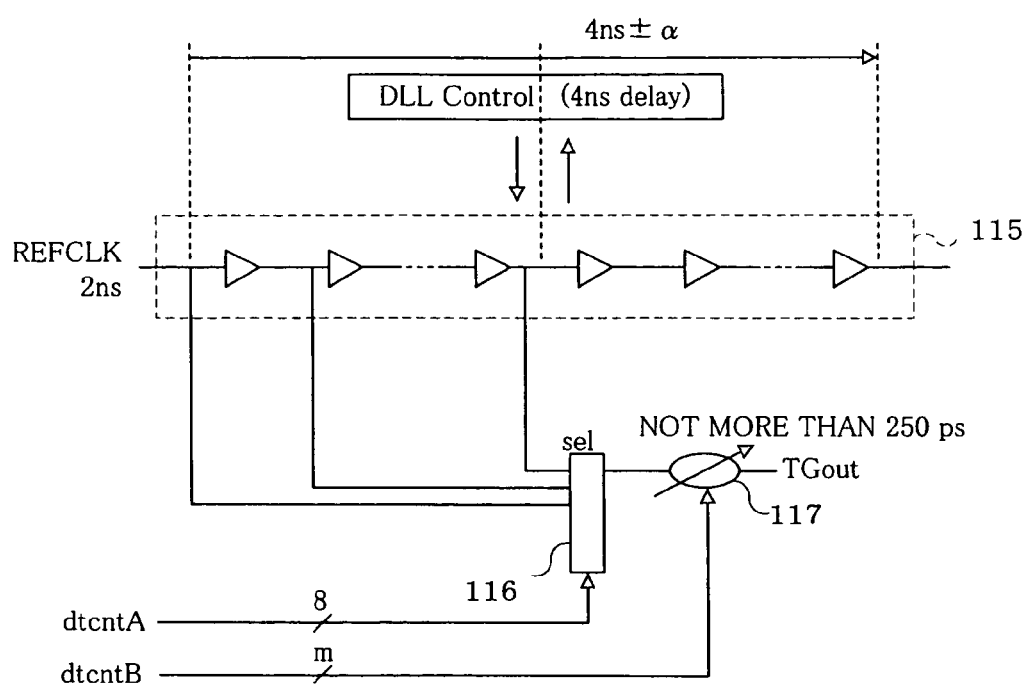
FIG. 17 is a block diagram illustrating a structure of a timing generator according to an eighth embodiment of the present invention.

Another example of the timing generator according to the present invention will now be described as an eighth embodiment with reference to FIG. 17.

A timing generator according to the eighth embodiment determines a length of a delay time of an output signal outputted from a logic gate on a last stage in a variable delay circuit as four nano-seconds (4 ns) which is twofold of two nano-seconds (2 ns) which is a maximum delay time of a delay signal outputted from a logic gate selected by a delay selector.

That is, in the DLL, there are provided inverters on multiple stages whose number is twofold of the number of stages required to generate the maximum delay time.

As a result, in the DLL, an output signal outputted from the logic gate on the last stage is fed back and phase-locked. Therefore, the accuracy of the DLL is determined as an error of the delay time of the output signal outputted from the last stage. Therefore, there is generated an error $\pm\alpha$ to the delay time corresponding to 4 ns in the eighth embodiment.

As a result, an error generated with respect to the maximum delay time corresponding to 2 ns used as the delay time can be suppressed to $\pm\alpha/2$.

For example, when a delay time of 250 pico-seconds (ps) is generated per inverter, providing inverters on eight stages can obtain the delay time of 2 ns in the variable delay circuit. On the contrary, in this embodiment, phase locking is performed with respect to the delay time of 4 ns by providing the inverters on 16 stages. Therefore, the error per inverter is ±α/16.

Thus, the delay time and the error when the delay selector 116 selects an output of the inverter on the first stage become 250 ps±α/16. Further, the delay time and the error when an output of the inverter on the second stage is selected become 500 ps±2α/16 Likewise, an error of an output from each inverter on the third stage or the following stages is a value obtained by multiplying the number of stages by ±α/16. In this manner, according to the eighth embodiment, the error can be reduced, and the practical accuracy can be improved.

Ninth Embodiment

Figure 18:
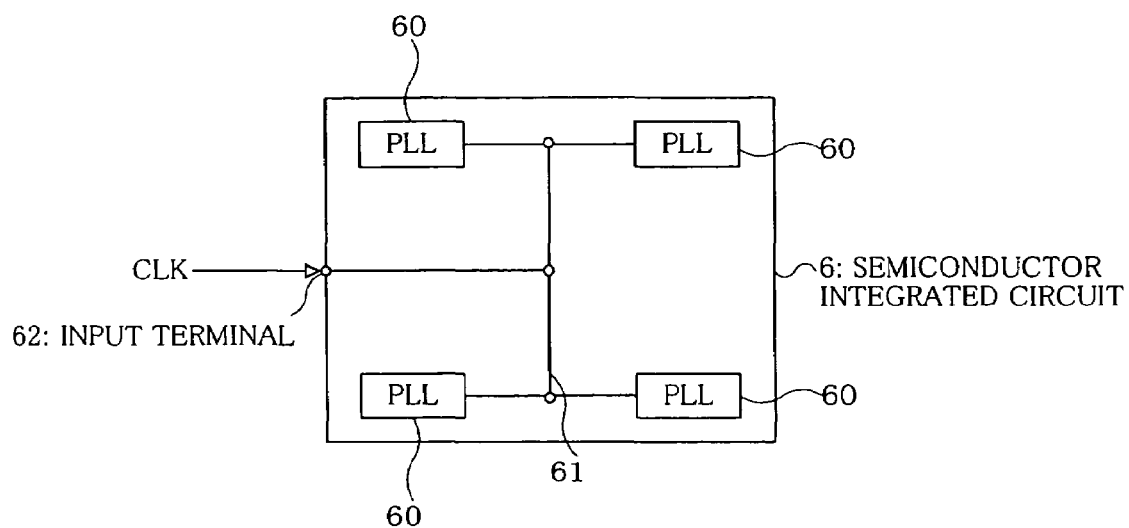
FIG. 18 is a circuit diagram illustrating a structure of a semiconductor integrated circuit according to a ninth embodiment of the present invention.

An example of a semiconductor integrated circuit according to the present invention will now be described as a ninth embodiment with reference to FIG. 18.

A semiconductor integrated circuit according to the ninth embodiment comprises four phase-locked loop circuits (PLL) 60 and a wiring 61 which distributes a reference clock signal having a low frequency to each phase-locked loop circuit.

A structure of each PLL is the same as the structure of the PLL in the above-described first embodiment. In this embodiment, by using the digitally-controlled PLL which has a small power consumption and can be reduced in size, a plurality of PLLs can be provided on the semiconductor integrated circuit.

It is to be noted that any PLL described in conjunction with the second and third embodiments may be used as the PLL.

Furthermore, the reference clock signal having a low frequency with a small skew is inputted to each PLL 60 as an input signal, an operation clock having a high frequency can be self-oscillated in each PLL 60. As a result, a relay buffer for the clock signal is no longer necessary, a skew of the clock signal can be reduced, and designing can be facilitated.

Moreover, as a matter of fact, the skew of the reference clock signal is mainly generated due to a propagation time of the wiring 61 from an input terminal 62 for the reference clock to each PLL 60. In this embodiment, therefore, wiring lengths from the input terminal 62 for the reference clock to the respective PLLs 60 are equalized.

10th Embodiment

Another example of the PLL according to the present invention will now be described as a ninth embodiment with reference to FIG. 19.

Figure 4:
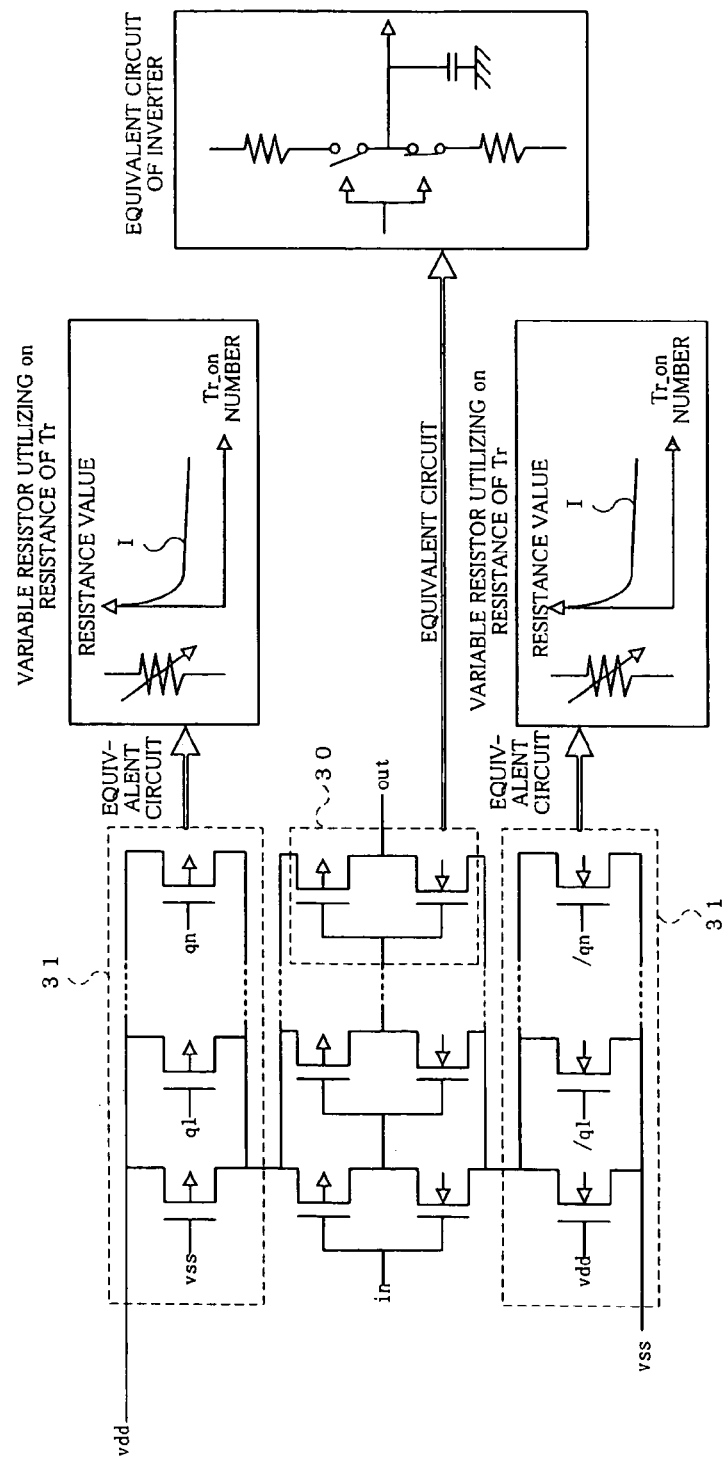
FIG. 4 is an explanatory view of delay time setting by a variable resistor in the first embodiment according to the present invention.

When controlling a delay time in the logic gate based on the resistor to which the logic gate is connected, a delay quantity has hyperbolic characteristics with respect to the number of bits having the first value in the control signal (the number of transistors (Tr) which are on) (which will be referred to as a "DA value" hereinafter) as indicated by, e.g., the curved line I in FIG. 4. Therefore, a band of the lock loop and a jitter quantity may differ depending on a range of the DA value in some cases.

Thus, in the 10th embodiment, a description will be made as to an example of the PLL comprising a ring oscillator which can realize a delay quantity having a higher linearity with respect to the DA value. it is to be noted that the structure of the PLL in the 10th embodiment is the same as the structure of the PLL in the above-described first embodiment except the ring oscillator (RING OSC), thereby eliminating the detailed explanation of the same parts.

A basic structure of the ring oscillator according to the 10th embodiment will be first described with reference to FIG. 19.

The ring oscillator according to this embodiment comprises logic gates 205 for reversed outputs which are connected with each other on multiple stages and in which an output from a last stage is inputted to a first stage, variable current sources 206 which are provided between the respective logic gates and reference voltage sources and restrict upper limits of current values, and a control circuit.

The control circuit comprises constant current sources 201 whose number is equal to the number of bits in the control signal and which are connected with each other in parallel, switching elements 202 which are connected to the respective constant current sources in series, a current/voltage conversion circuit 203 which converts a total current value passed through the switching elements into a bias voltage value, and a current source bias circuit 204 which applies a bias voltage to the variable current sources 206.

Each switching element 202 corresponds to each bit value (S0 to Sm−1) constituting the control signal (output from the counter 2) in a one-to-one relationship. Additionally, it enters a conductive state when a corresponding bit value is "H", and enters a non-conductive state when it is "L".

Figure 19:
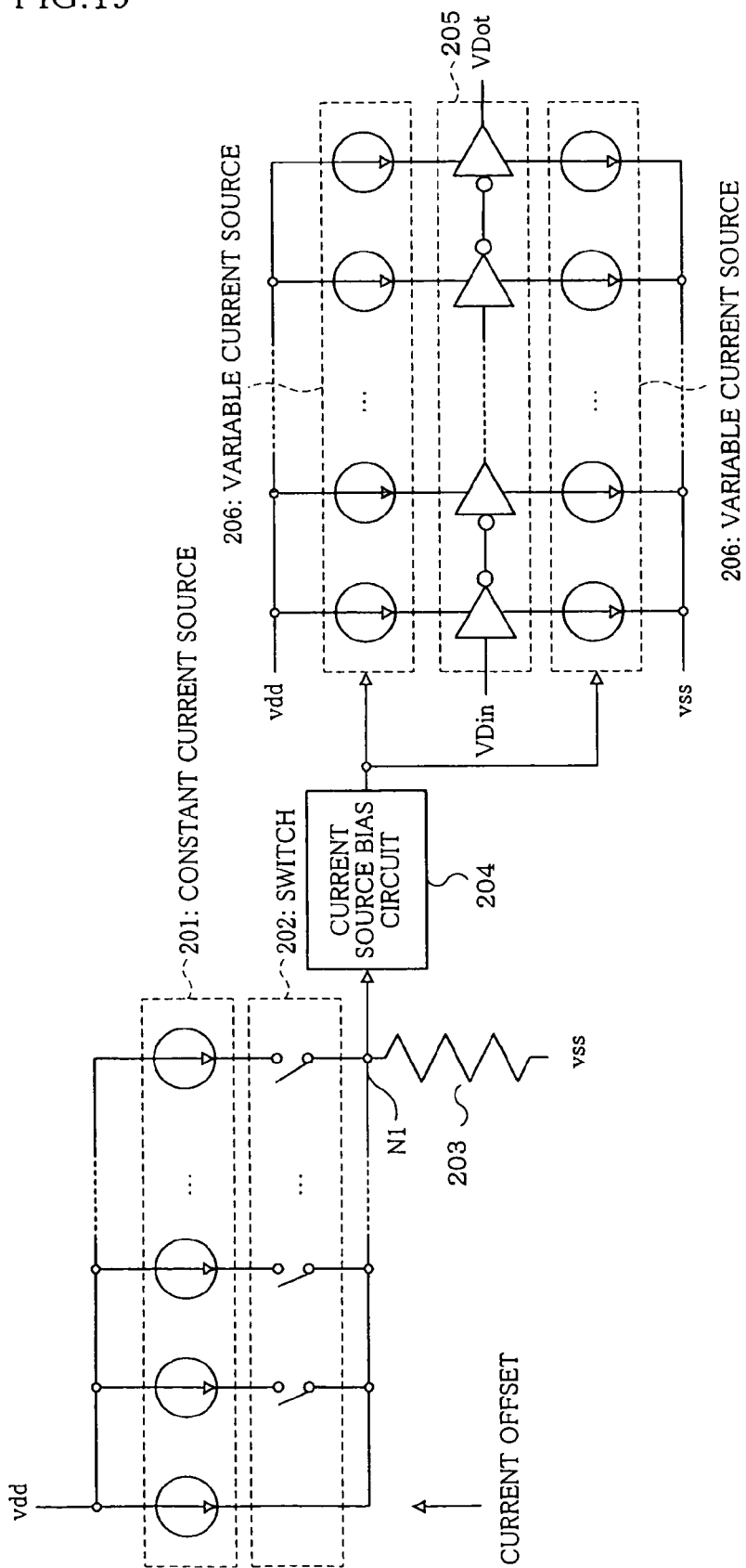
FIG. 19 is a circuit diagram illustrating a basic structure of a ring oscillator according to a tenth embodiment of the present invention.

Further, all the currents which have passed through the conductive switching elements flow together at a node N1 shown in FIG. 19. Therefore, a current which is in proportion to the number of bits having a bit value of "H" (DA value) flows through the node N1. Furthermore, the current passing through N1 flows through the current/voltage conversion circuit 203 such as a current resistor.

Moreover, assuming that an impedance of the current source bias circuit 204 is infinite in reality, all the currents which have flowed into the node N1 can be caused to flow through the current/voltage conversion circuit 203. As a result, a potential of N1 can be caused to be substantially in proportion to a current value flowing through N1.

Additionally, the variable current source 206 passes a current within an upper limit value which substantially linearly responds to an increase/decrease in a bias voltage value.

Meanwhile, an output potential of the logic gate for reversed outputs such as a CMOS is determined based on a charge quantity charged in a parasitic capacitance of the logic gate. Therefore, a time required for the output potential of the logic gate to reach a threshold value can be controlled by controlling the current value flowing through the logic gate by the variable current source.

Figure 20:
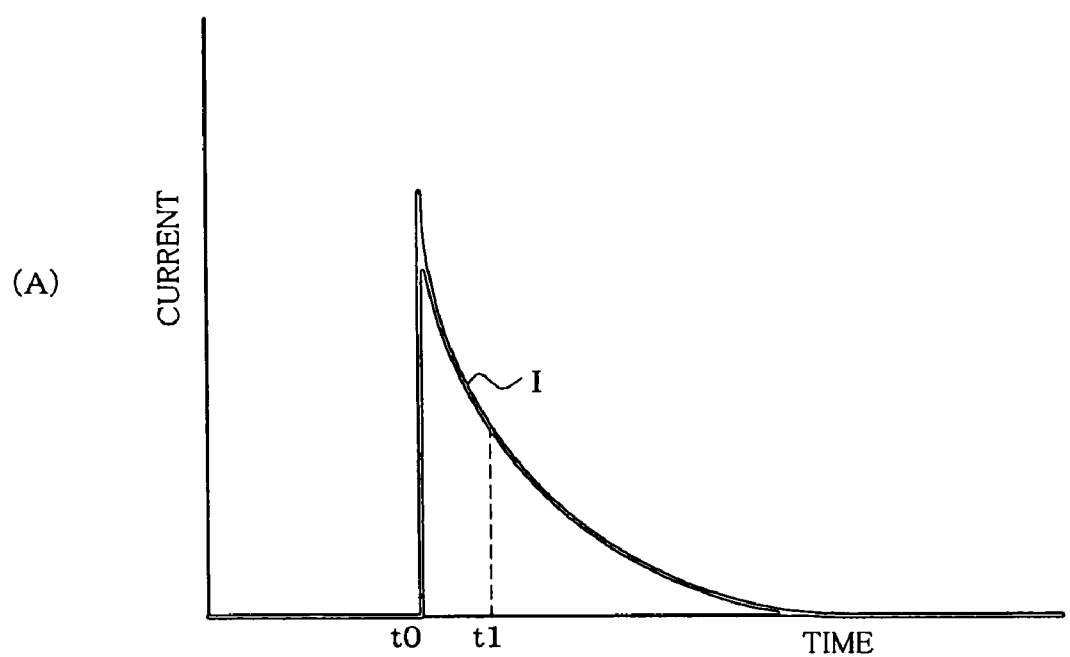
FIGS. 20(A) and (B) are graphs illustrating a change in a current flowing through a logic gate with a time.
Figure 20:
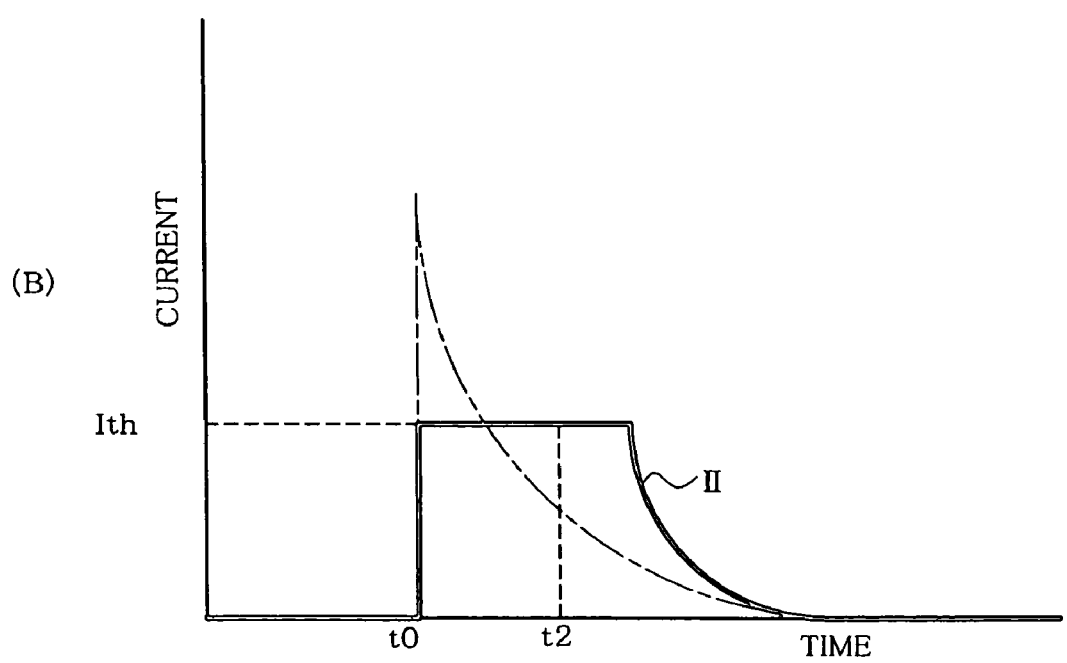

Here, FIG. 20(A) schematically shows an example of a change in current flowing through the logic gate with a time when the output potential is reversed in cases where the upper limit of the current is not restricted in the form of a curved line I. As indicated by the curved line I, the current is decreased as a time elapses immediately after reversal of the output potential at a time t0. Further, a charge quantity charged in the parasitic capacitance corresponds to an area surrounded by the curved line I and a horizontal axis. Furthermore, a value obtained by dividing the charged electric charge quantity Q by the parasitic capacitance C becomes an output potential V (=Q/C).

Here, it is assumed that the output potential V has reached a threshold voltage Vth at a time t1, for example.

On the contrary, FIG. 20(B) schematically shows an example of a change in current flowing through the logic gate with a time when an upper limit Ith of the current is restricted in the form of a curved line II. As indicated by the curved line II, the current value shifts with the upper limit value Ith in a fixed period from a time t0, and is thereafter decreased. Since the electric charge quantity charged until the output potential reaches the threshold value is fixed, a time required for the output potential to reach the threshold value is long as the upper limit value Ith of the current is low.

Incidentally, when the output potential has reached the threshold value at, e.g., a time t2, the charge quantity at this moment is the same as the charge quantity charged until the time t1 when the current is not restricted.

Thus, in this embodiment, the upper limit value of the current caused to flowing through the logic gate 206 is associated with the number of bits having the first value in the control signal (DA value). As a result, the current value flowing through the variable current source 206 can be reduced in accordance with an increase in the number of bits indicative of "H" in the control signal (DA value), and an oscillation cycle can be prolonged. Moreover, the current value flowing through the variable current source 206 can be increased in accordance with a reduction in the number of bits indicative of "H", and the oscillation cycle can be shortened.

For this purpose, in this embodiment, it is good enough to constitute the constant current circuit of a transistor and apply a bias voltage between a drain and a source of this transistor. By doing so, as indicated by, e.g., a curved line I in FIG. 21(A), a relationship between the DA value and a bias voltage Vds can be made linear in a saturated zone of the transistor.

Figure 21:
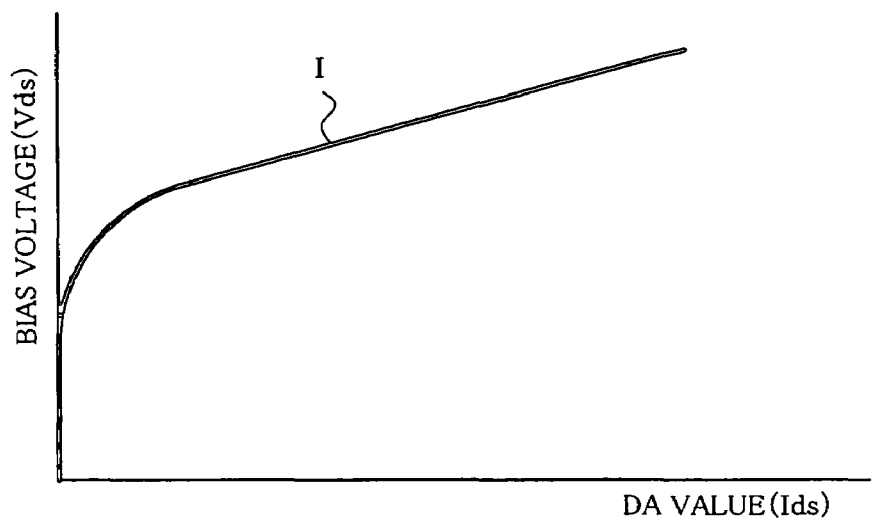
FIG. 21(A) is a graph showing a relationship between the number of bits having a first value in a control signal (DA value) and a bias voltage, and (B) is a graph showing a relationship between a restricted current value and a time required for an output potential to reach a threshold value.
Figure 21:
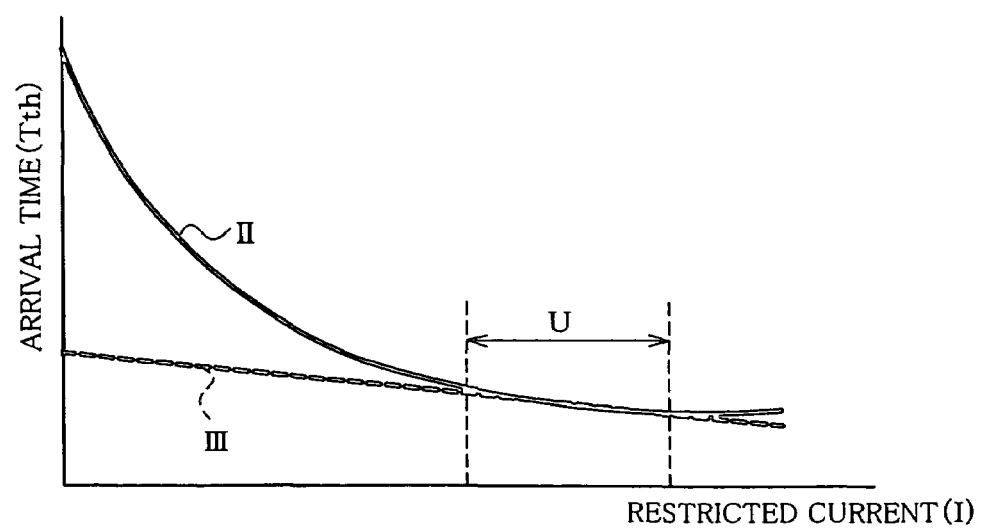

Meanwhile, a charge time Tth=Q/Vth=CVth/Ith required for the output voltage to reach the threshold value Vth is in inverse proportion to the upper limit value Ith of the current as indicated by, e.g., a curved line II in FIG. 21(B). Therefore, the charge time Tth is also in inverse proportion to the DA value.

However, a relationship between the upper limit value of the current and the charge time can be linearly approximated if it falls within a fixed range as indicated by a broken line III in FIG. 21(B). Additionally, by changing the upper limit value within this range enabling linear approximation, a total delay time of all the logic gates can be practically sufficiently linearly varied with respect to a change in the DA value even if a change quantity of a delay time of each logic gate is small.

A concrete structural example of the ring oscillator in the 10th embodiment will now be described with reference to FIGS. 22 and 23. The ring oscillator according to this concrete structural example comprises a current source 301 and a current DAC 302 which are shown in FIG. 22 and a multi-stage connection circuit 303 for inverters shown in FIG. 23.

It is to be noted that "DAC" described herein is an abbreviated name of a digital/analog converter, and the current DAC 302 has a function to convert digital data of the number of bits indicative of "H" in the control signal (DA value) into an analog current value.

Figure 22:
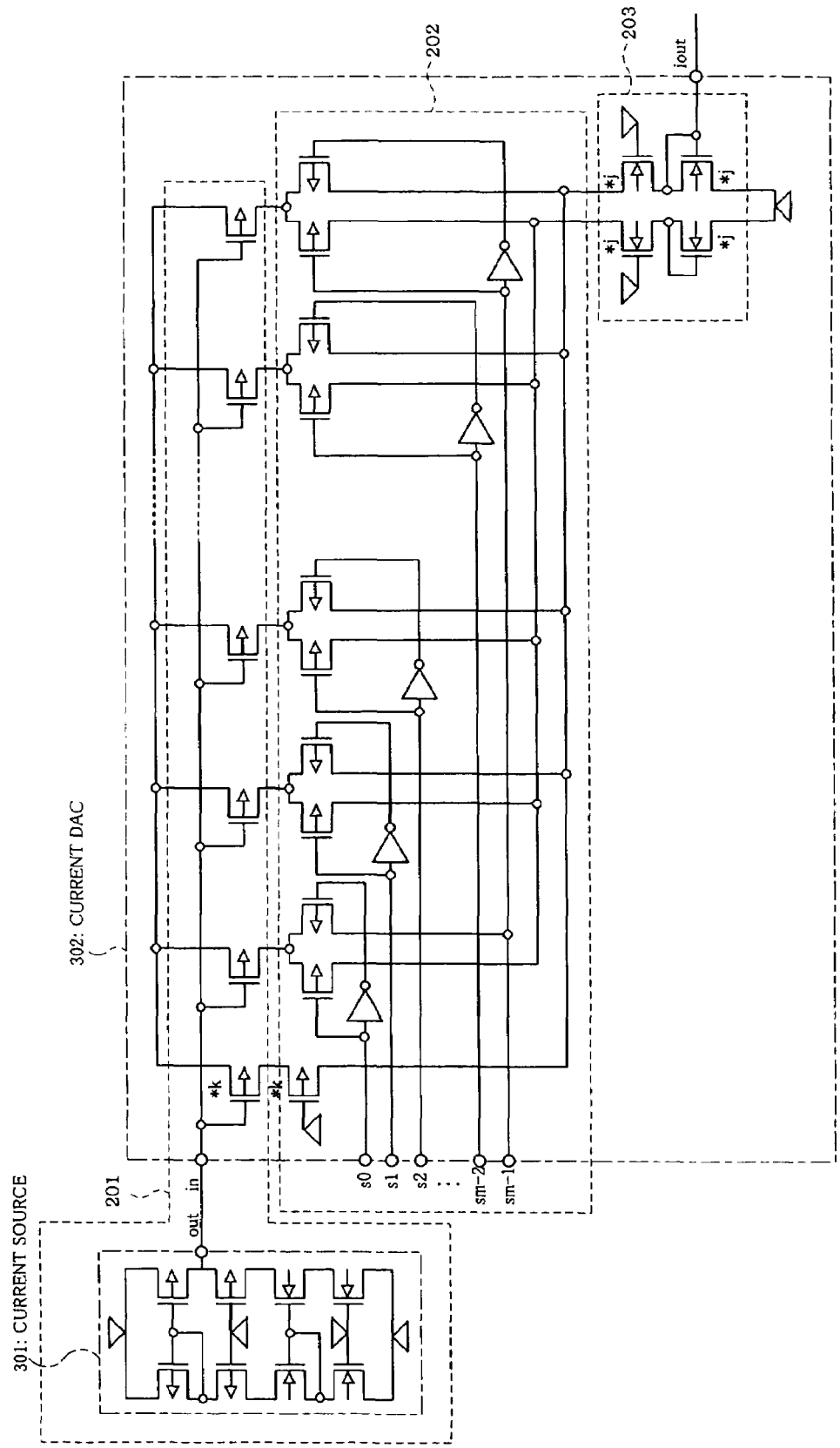
FIG. 22 is a circuit diagram illustrating a concrete structural example of the ring oscillator in the tenth embodiment according to the present invention.

Further, as shown in FIG. 22, the above-described constant current source 204 is constituted at part of the current source 301 and the current DAC 302. The current source 301 is constituted of a current mirror circuit. Furthermore, the current source 301 and each constant current source 201 corresponding to each bit value in the current DAC 302 have a relationship of the current mirror.

It is to be noted that the description has been given as to the example in which the current source 301 is constituted of the current mirror circuit in this embodiment, but it is good enough that the current source 301 and each constant current source 201 corresponding to each bit value in the current DAC 302 have the relationship of the current mirror, and the current source 301 may be constituted by vertically superposing transistors, for example.

Moreover, the above-described switching elements 202 are constituted of a transistor group in the current DAC 302.

Additionally, the above-described current/voltage conversion circuit 204 is constituted of an N channel transistor in the current DAC 302. The current/voltage conversion circuit 204 in this concrete example can be approximated to a resistor.

It is to be noted that a route through which an offset current is caused to flow is provided in parallel with each current path corresponding to each bit in the current DAC 302 in this embodiment. By passing the offset current, the N channel type transistor constituting the current/voltage conversion circuit 204 can be used in a saturated zone. As a result, even in a case where a current quantity is small, it is possible to prevent the N channel type transistor from operating at an operating point in an unsaturated zone. That is, a stable current/voltage conversion operation performed by the current/voltage conversion circuit 204 can be realized by passing the offset current irrespective of a current quantity.

Figure 23:
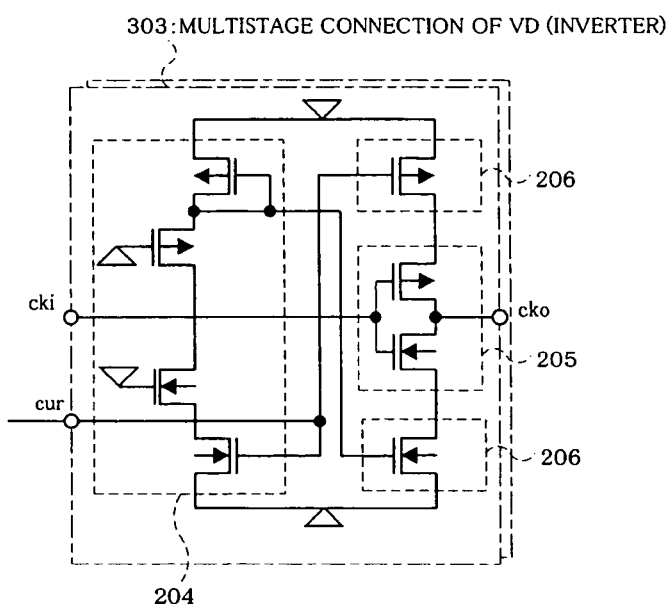
FIG. 23 is a circuit diagram following FIG. 22.
Figure 24:
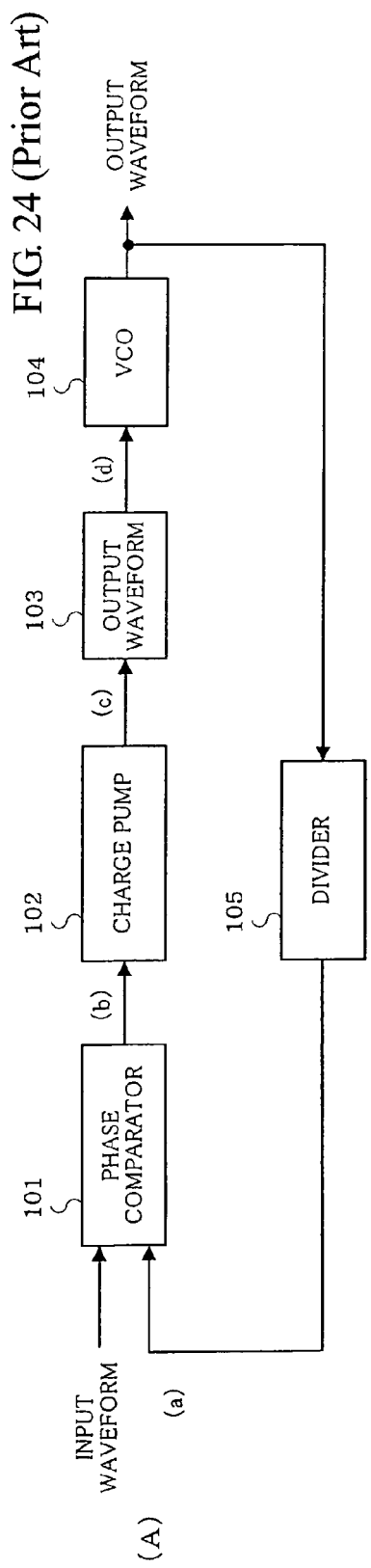
FIG. 24(A) is a block diagram illustrating a structure of a PLL according to a prior art, and (B) is a timing chart illustrating its operation.
Figure 24:
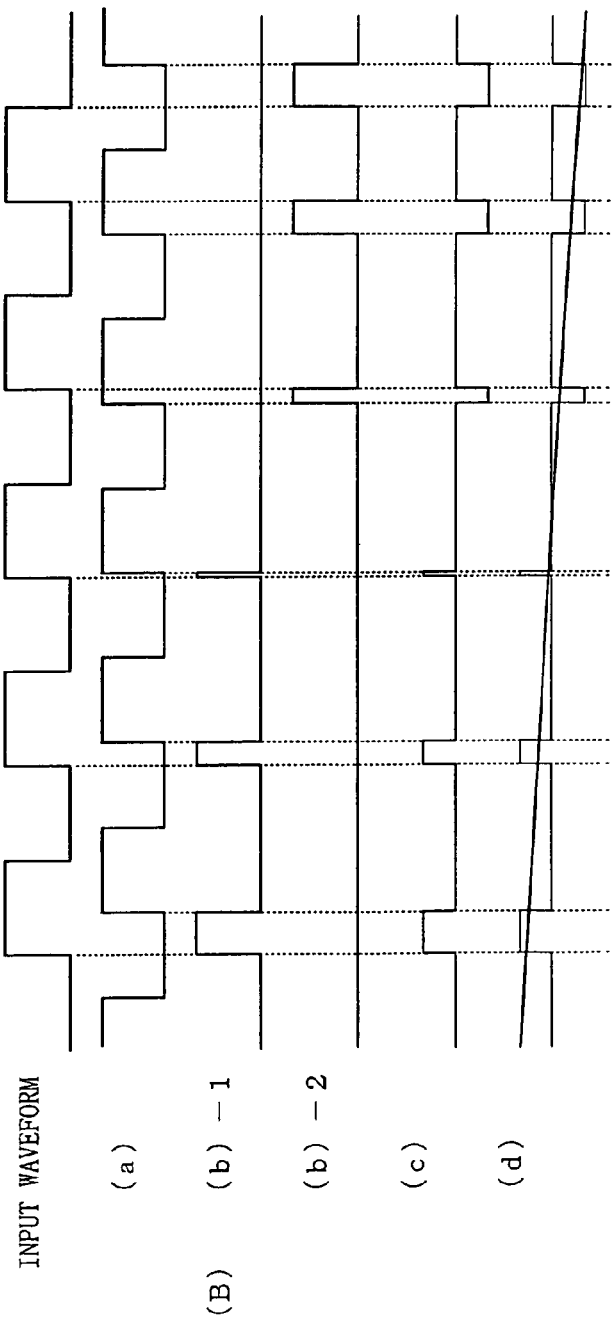
Figure 26:
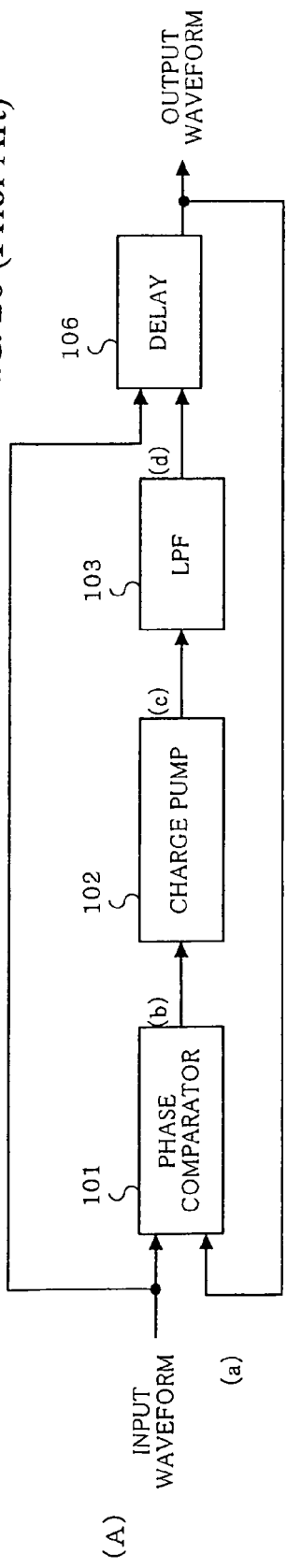
FIG. 26(A) is a block diagram illustrating a structure of a DLL according to a prior art, and (B) is a timing chart illustrating its operation.
Figure 26:
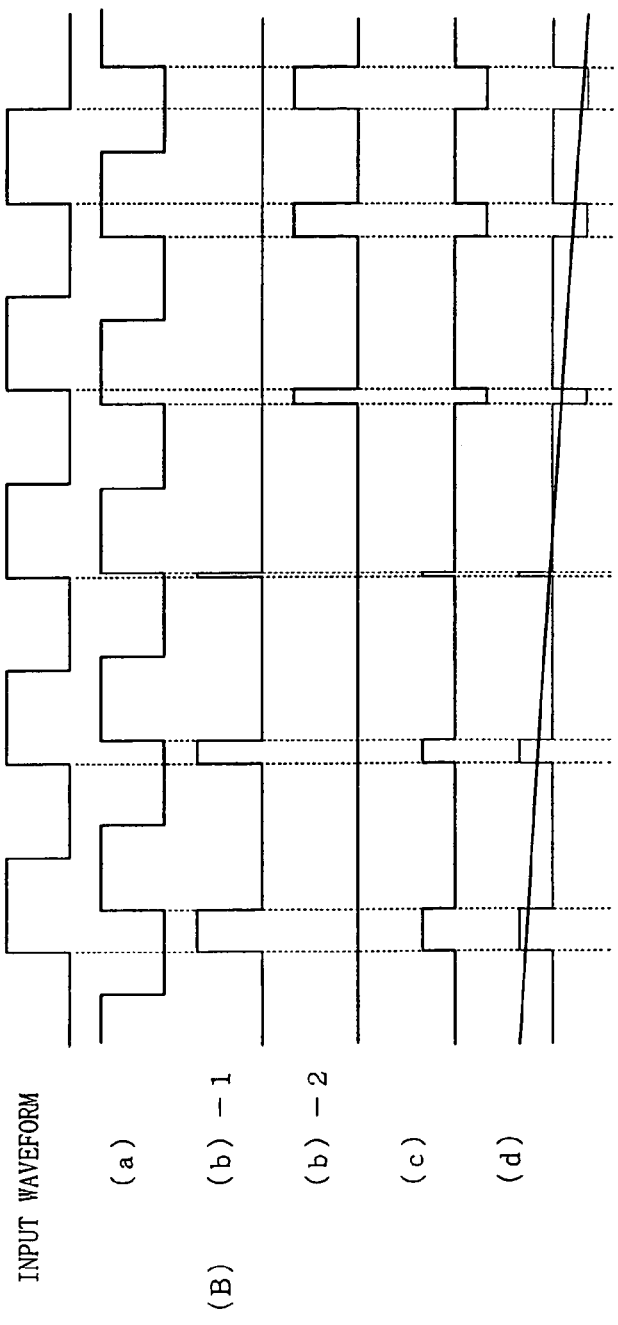
Figure 28:
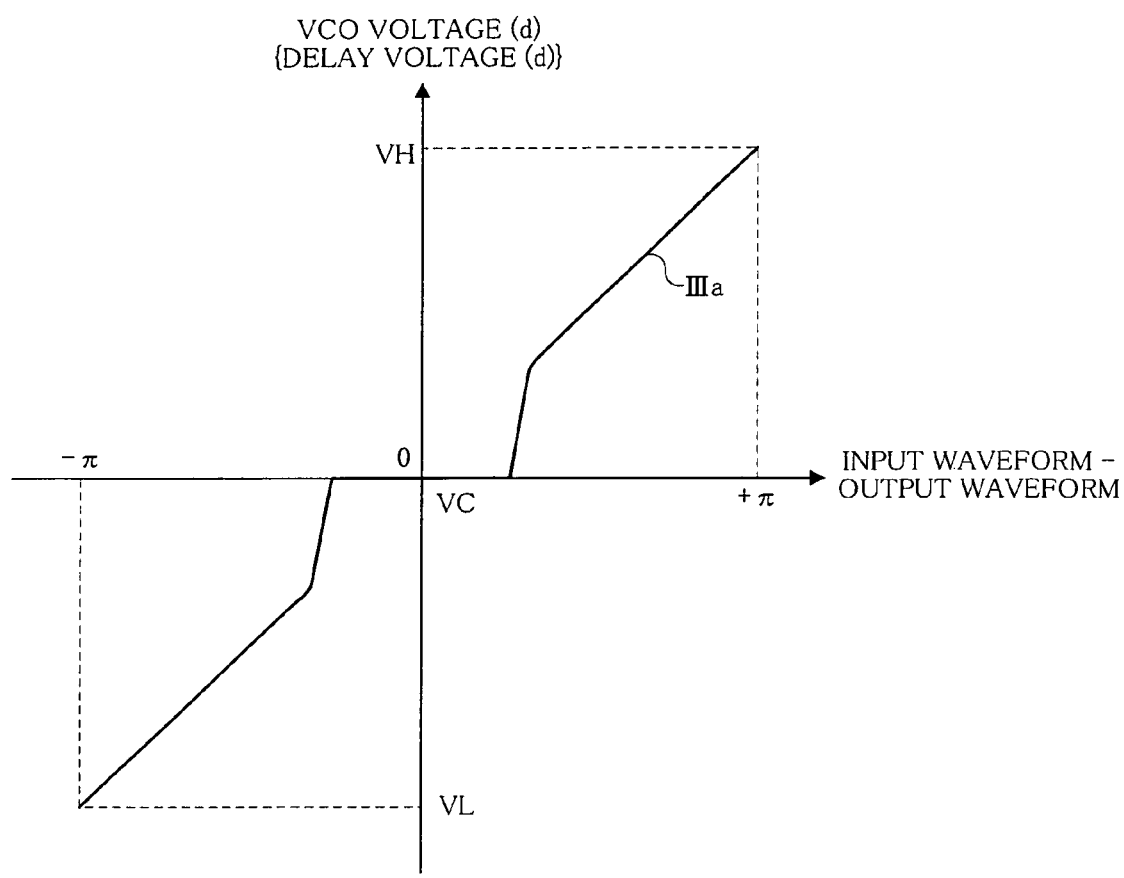
FIG. 28 is a graph showing a relationship between an actual PLL (DLL) circuit phase and a VCO (DELAY) voltage.

Further, as shown in FIG. 23, the above-described current source bias circuit 204 is constituted of a transistor in the multi-stage connection circuit 303 for the inverters.

Furthermore, the above-described logic gate 205 is constituted of a CMOS circuit in the inverter multi-stage connection circuit 303.

Moreover, the above-described variable current source 206 is constituted of a transistor in the inverter multi-stage connection circuit 303.

With such a structure, a bias voltage value which linearly corresponds to an increase/decrease in the number of bits having the first value in the control signal can be readily produced. As a result, a relationship between the number of bits having the first value in the control signal (DA value) and the oscillation cycle of the ring oscillator can be caused to have linear characteristics.

Incidentally, it is also preferable to use the structure of the ring oscillator described in conjunction with the 10th embodiment in the delay locked loop circuit according to the present invention expect for a point that an output from the last stage of the multi-stage logic gates is inputted to the first stage.

Although the description has been given as to the examples in which the present invention is constituted under the specific conditions in the foregoing embodiments, the present invention can be modified in many ways. For example, the description has been given as to the example in which the ring oscillator or the variable delay circuit is constituted of the inverters which are connected with each other on multiple stages in the foregoing embodiments, the logic gate for reversed outputs is not restricted to the inverter in the present invention. For example, NAND circuits or NOR circuits may be connected with each other on multiple stages.

As described above in detail, according to the digital-controlled PLL and DLL, the timing generator using such a PLL or DLL and the semiconductor test instrument including this timing generator of the present invention, a reduction in power consumption, a reduction in size of a circuit scale and a reduction in cost can be achieved by providing the circuit configuration based on logic elements without using analog circuits for the PLL and DLL.

Additionally, since an analog circuit whose response speed is low, especially an LPF is not used for the PLL and DLL, the phase can be locked with the high accuracy in a higher band. Therefore, a lock loop band can be improved.

Further, in the phase comparator of the PLL and DLL, a lead and a lag of the phase is detected as a value of the feedback signal in synchronization with the input signal irrespective of the phase difference. Therefore, the reliability of phase comparison can be improved.

Furthermore, in the PLL and DLL, since the priority encoder type counter which increases/decrease the number of bits indicative of the first value in the control signal by one based on the phase signal is used, only a value of one bit is changed at a time in the control signal. Therefore, the reliability can be improved.

Moreover, according to the semiconductor integrated circuit of the present invention, since the plurality of digitally-controlled PLLs which have small power consumption and can be reduced in size are provided, the clock signal having a low frequency with a small skew can be inputted to each PLL, and the operation clock having a high frequency can be self-oscillated in each PLL. As a result, a relay buffer for the clock signal is no longer necessary, a skew of the clock signal can be reduced, and designing can be facilitated.

The invention claimed is:

1. A delay locked loop circuit comprising:
a phase comparator which receives a binary output signal and an input signal, samples the binary output signal by a timing of a rising edge or a falling edge but not both of the input signal, and outputs a phase signal representing a lead or a lag of a phase of the binary output signal relative to the input signal where the lead or lag is represented solely by one bit of either high or low;
a counter which receives the phase signal, outputs a control signal, increases a value of the control signal when the phase signal has a value representing a lead of a phase, and decreases a value of the control signal when the phase signal has a value representing a lag of the phase; and
a variable delay circuit which receives the control signal and the input signal, generates the binary output signal, prolongs a delay time of the binary output signal relative to the input signal when a value in the control signal is large, and shortens the delay time of the binary output signal relative to the input signal when a value in the control signal is small;
wherein the phase comparator is configured by a dynamic D flip-flop and a non-dynamic D flip-flop which receives an output from the dynamic D flip-flop so that the phase comparator minimizes a hysteresis width which is dependent upon a change of direction of the phase signal that is output from the phase comparator.

2. The delay locked loop circuit according to claim 1, wherein:
the phase comparator receives the binary output signal and the input signal, detects a value of the output signal in synchronization with the input signal, and outputs a detection result as a phase signal representing a lead or a lag of a phase of the output signal relative to the input signal;
the counter receives the phase signal, outputs a control signal constituted of a plurality of bits each of which represents a first value or a second value, increases the number of bits representing the first value in the control signal by one when the phase signal has a value representing a lead of the phase, and decreases the number of bits representing the first value in the control signal by one when the phase signal has a value representing a lag of the phase; and
the variable delay circuit receives the control signal and the input signal, generates the binary output signal, prolongs a delay time of the binary output signal relative to the input signal when the number of bits representing the first value in the control signal is large, and shortens the delay time of the output signal relative to the input signal when the number of bits representing the first value is small.

3. The delay locked loop circuit according to claim 1, wherein;
the dynamic D flip-flop has a structure in which a plurality of dynamic latch circuits are directly connected with one another where each of the latch circuits is configured by an analog switch with an inverter; and
the non-dynamic D flip-flop has a structure in which a plurality of latch circuits are directly connected with one another where each of the latch circuits is configured by an analog switch with an inverter and a loop circuit having another inverter and another analog switch therein.

4. The delay locked loop circuit according to claim 1, wherein the counter comprises flip-flops and selectors which select signals to be inputted to the flip-flops, the number of stages of these members being equal to the number of bits in the control signal;
wherein each of the flip-flops outputs bit values constituting the control signal one by one; each of the selectors corresponds to each flip-flop in a one-to-one relationship; and
wherein the selector selects and inputs an output value of the flip-flop on a preceding stage to a corresponding flip-flop when the phase signal has a value representing a lead of the phase, and the selector selects and inputs an output value of the flip-flop on a next stage to a corresponding flip-flop when the phase signal has a value representing a lag of the phase; and
wherein the selector on a first stage inputs a first value as an output value of the flip-flop on the preceding stage to the flip-flop on a first stage, and the selector on a last stage inputs a second value as an output value of the flip-flop on the next stage to the flip-flop on a last stage.

5. The delay locked loop circuit according to claim 1, wherein:
the phase comparator outputs a phase signal indicative of a coincidence in phase between the binary output signal and the input signal when a lag of the phase is not detected by a first D flip-flop and a lead of the phase is not detected by a second D flip-flop either; and
the counter comprises flip-flops and selectors which select signals to be inputted to the flip-flops, the number of stages of the flip-flops and selectors being equal to the number of bits in the control signal;
wherein each of the flip-flops outputs bit values constituting the control signal one by one, and each of the selectors corresponds to each flip-flop in a one-to-one relationship;
wherein the selector selects and inputs an output value of the flip-flop on a preceding stage to a corresponding flip-flop when the phase signal has a value indicative of a lead of the phase, the selector selects and inputs an output value of the flip-flop on a next stage to a corresponding flip-flop when the phase signal has a value indicative of a lag of the phase, and the selector selects and inputs an output value of a corresponding flip-flop itself to a corresponding flip-flop when the phase signal has a value indicative of a coincidence in phase; and
wherein the selector on a first stage inputs a first value to the flip-flop on a first stage as an output value of the flip-flop on the preceding stage, and the selector on a last stage inputs a second value to the flip-flop on a last stage as an output value of the flip-flop on the next stage.

6. The delay locked loop circuit according to claim 1, wherein the variable delay circuit comprises logic gates for reversed outputs which are connected with each other on multiple stages, and variable resistors provided between the logic gates and power supply voltage sources;
  wherein the variable delay circuit prolongs the delay time by increasing resistance values of the variable resistors when the number of bits indicative of a first value is increased; and
  wherein the variable delay circuit shortens the delay time by decreasing the resistance values of the variable resistors when the number of bits indicative of the first value is reduced.

7. The delay locked loop circuit according to claim 6, wherein:
  the variable resistance circuit comprises resistors whose number is equal to the number of bits in the control signal and which are connected with each other in parallel, and switching elements which are connected with the respective resistors in series; and
  wherein each switching element corresponds to each bit value constituting the control signal in a one-to-one relationship, enters a non-conductive state when a corresponding bit value is a first value, and enters a conductive state when the corresponding bit value is a second value.

8. The delay locked loop circuit according to claim 1, wherein the variable delay circuit comprises logic gates for reversed outputs which are connected with each other on multiple stages, and variable capacitances provided between the respective logic gates and a grounded voltage source;
  wherein the variable delay circuit prolongs the delay time by increasing capacitance values of the variable capacitances when the number of bits indicative of a first value is increased; and
  wherein the variable delay circuit shortens the delay time by decreasing the capacitance values of the variable capacitances when the number of bits indicative of the first value is reduced.

9. The delay locked loop circuit according to claim 8, wherein the variable capacitance comprises:
  load capacitances whose number is equal to the number of bits in the control signal and which are connected with each other in parallel; and
  switching elements which are connected with the respective capacitances in series;
  wherein each switching element corresponds to each bit constituting the control signal in a one-to-one relationship, enters a conductive state when a corresponding bit value is a first value, and enters a non-conductive state when the corresponding bit value is a second value.

10. The delay locked loop circuit according to claim 1, wherein the variable delay circuit comprises:
  logic gates for reversed outputs which are connected with each other on multiple stages;
  variable current sources which are respectively provided between the respective logic gates and a reference voltage source and restrict upper limits of current values; and
  a control circuit which prolongs the delay time by decreasing current values flowing through the variable current sources when the number of bits indicative of a first value in the control signal is increased, and shortens the delay time by increasing current values flowing through the variable current sources when the number of bits indicative of the first value is decreased.

11. The delay locked loop circuit according to claim 10, wherein the control circuit comprises:

constant current sources whose number is equal to the number of bits in the control signal and which are connected with each other in parallel;
switching elements which are connected with the respective current sources in series;
a current/voltage conversion circuit which converts a total current value which has passed through the switching elements into a bias voltage; and
a current source bias circuit which applies the bias voltage to the variable current source,
wherein the switching element corresponds to each bit value constituting the control signal in a one-to-one relationship, enters a non-conductive state when a corresponding bit value is a first value, and enters a conductive state when it is a second value, and
wherein the constant current source supplies a current within the upper limit which substantially linearly responds to an increase/decrease in the bias voltage.

12. A timing generator comprising:
  a delay locked loop circuit including a variable delay circuit in which logic gates on a plurality of stages are connected with each other in series; and
  a delay selector which selects and produces an output from any of the logic gates as a delay signal,
  wherein the delay locked loop circuit comprises:
    a phase comparator which receives a binary output signal and an input signal, detects a value of the binary output signal in synchronization with the input signal by sampling the binary output signal by a timing of a rising edge or a falling edge but not both of the input signal, and outputs a detection result as a phase signal indicative of a lead or a lag of a phase of the binary output signal relative to the input signal where the lead or lag is represented solely by one bit of either high or low, where the phase comparator is configured by a dynamic D flip-flop and a non-dynamic D flip-flop which receives an output from the dynamic D flip-flop so that the phase comparator minimizes a hysteresis width which is dependent upon a change of direction of the phase signal that is output from the phase comparator;
    a counter which receives the phase signal, outputs a control signal constituted of a plurality of bits each of which represents a first value or a second value, increases the number of bits representing the first value in the control signal by one when the phase signal has a value indicative of a lead of the phase, and decreases the number of bits representing the first value in the control signal by one when the phase signal has a value representing a lag of the phase; and
    the variable delay circuit which receives the control signal and the input signal, generates the binary output signal, prolongs a delay time of the binary output signal relative to the input signal when the number of bits representing the first value in the control signal is large, and shortens the delay time of the output signal relative to the input signal when the number of bits representing the first value is small.

13. The timing generator according to claim 12, wherein a delay time of an output signal from the logic gate on a last stage in the variable delay circuit is longer than a maximum delay time of a delay signal from the logic gate selected by the delay selector.

14. A semiconductor test instrument comprising:
  a timing generator which outputs a delay clock signal obtained by delaying a reference clock signal for a predetermined time;

a pattern generator which outputs a test pattern signal in synchronization with the reference clock signal;

a waveform shaper which shapes the test pattern signal in accordance with a test target device and supplies the test pattern signal to the test target device; and a logic comparator which compares a response output signal of the test target device with the expected value data signal, wherein the timing generator comprises:

a delay locked loop circuit including a variable delay circuit in which logic gates on a plurality of stages are connected with each other in series; and a delay selector which selects an output from any of the logic gates and outputs it as a delay signal, and wherein the delay locked loop circuit comprises:

a phase comparator which receives a binary output signal and an input signal, detects a value of the binary output signal in synchronization with the input signal by sampling the binary output signal by a timing of a rising edge or a falling edge but not both of the input signal, and outputs a detection result as a phase signal indicative of a lead or a lag of a phase of the binary output signal relative to the input signal where the lead or lag is represented solely by one bit of either high or low;

a counter which receives the phase signal, outputs a control signal constituted of a plurality of bits each of which represents a first value or a second value, increases the number of bits representing the first value in the control signal by one when the phase signal has a value representing a lead of the phase, and decreases the number of bits representing the first value in the control signal by one when the phase signal has a value representing a lag of the phase; and the variable delay circuit which receives the control signal and the input signal, outputs the binary output signal, prolongs a delay time of the binary output signal relative to the input signal when the number of bits representing the first value in the control signal is large, and shortens the delay time of the binary output signal relative to the input signal when the number of bits representing the value is small, wherein the phase comparator is configured by a dynamic D flip-flop and a non-dynamic D flip-flop which receives an output from the dynamic D flip-flop so that the phase comparator minimizes a hysteresis width which is dependent upon a change of direction of the phase signal that is output from the phase comparator.

* * * * *